United States Patent
Nam et al.

(10) Patent No.: US 10,121,735 B2
(45) Date of Patent: Nov. 6, 2018

(54) METHOD OF DESIGNING A LAYOUT OF A SEMICONDUCTOR DEVICE, AND A SEMICONDUCTOR DEVICE INCLUDING A FIN

(71) Applicant: SAMSUNG ELECTRONICS CO., LTD., Suwon-si, Gyeonggi-do (KR)

(72) Inventors: Seon-Ah Nam, Yongin-si (KR); Ikuo Nakamatsu, Seongnam-si (KR); Dong-Hyun Kim, Yongin-si (KR); Chul-Hong Park, Seongnam-si (KR); Yun-Se Oh, Anseong-si (KR); Hae-Wang Lee, Yongin-si (KR); Ho-Jun Choi, Hwaseong-si (KR)

(73) Assignee: SAMSUNG ELECTRONICS CO., LTD., Suwon-si, Gyeonngi-Do (KR)

( * ) Notice: Subject to any disclaimer, the term of this patent is extended or adjusted under 35 U.S.C. 154(b) by 0 days.

(21) Appl. No.: 15/794,131

(22) Filed: Oct. 26, 2017

(65) Prior Publication Data
US 2018/0174953 A1    Jun. 21, 2018

(30) Foreign Application Priority Data
Dec. 15, 2016 (KR) .................. 10-2016-0171888

(51) Int. Cl.
| | |
|---|---|
| *H01L 27/088* | (2006.01) |
| *H01L 23/498* | (2006.01) |
| *H01L 23/48* | (2006.01) |
| *H01L 29/78* | (2006.01) |
| *H01L 29/66* | (2006.01) |

(52) U.S. Cl.
CPC ........ *H01L 23/49827* (2013.01); *H01L 23/48* (2013.01); *H01L 27/0886* (2013.01); *H01L 29/6681* (2013.01); *H01L 29/785* (2013.01); *H01L 2924/13067* (2013.01)

(58) Field of Classification Search
CPC .................. H01L 27/0886; H01L 29/6681; H01L 29/785
USPC ........................................................ 257/401
See application file for complete search history.

(56) References Cited

U.S. PATENT DOCUMENTS

| | | | |
|---|---|---|---|
| 8,739,104 | B1 | 5/2014 | Penzes et al. |
| 8,799,833 | B2 | 8/2014 | Wann et al. |
| 8,975,712 | B2 | 3/2015 | Rashed et al. |

(Continued)

FOREIGN PATENT DOCUMENTS

| | | |
|---|---|---|
| KR | 1020150034506 | 4/2015 |
| KR | 1020160023538 | 3/2016 |

*Primary Examiner* — David Vu
*Assistant Examiner* — Brandon Fox
(74) *Attorney, Agent, or Firm* — F. Chau & Associates, LLC

(57) ABSTRACT

A semiconductor device includes active fins on a substrate. Gate lines each extend in the second direction on the active fins. A contact plug is positioned on the active fins. A first via is in one of the first contact plugs. A first conductive line overlaps a first via. A first distance from a first active fin on which a first gate line of the gate lines is formed to an end of the first gate line is more than a predetermined distance. A second distance from a second active fin on which the first gate line is formed to the first active fin of the active fins is equal to or less than the predetermined distance. The second active fin is spaced apart from the first contact plugs to not overlap the first contact plugs.

18 Claims, 35 Drawing Sheets

(56) References Cited

U.S. PATENT DOCUMENTS

| | | |
|---|---|---|
| 8,987,828 B2 | 3/2015 | Moroz et al. |
| 9,105,467 B2 | 8/2015 | Lee et al. |
| 9,659,932 B2 * | 5/2017 | Huang .................. H01L 29/785 |
| 2013/0277760 A1 * | 10/2013 | Lu ........................... H01L 29/10 |
| | | 257/401 |
| 2013/0330889 A1 * | 12/2013 | Yin .................. H01L 21/82382 |
| | | 438/197 |
| 2014/0325466 A1 * | 10/2014 | Ke ...................... G06F 17/5072 |
| | | 716/119 |
| 2016/0055290 A1 | 2/2016 | Weng |
| 2016/0284709 A1 | 9/2016 | Basker et al. |
| 2017/0011160 A1 | 1/2017 | Baek et al. |

\* cited by examiner

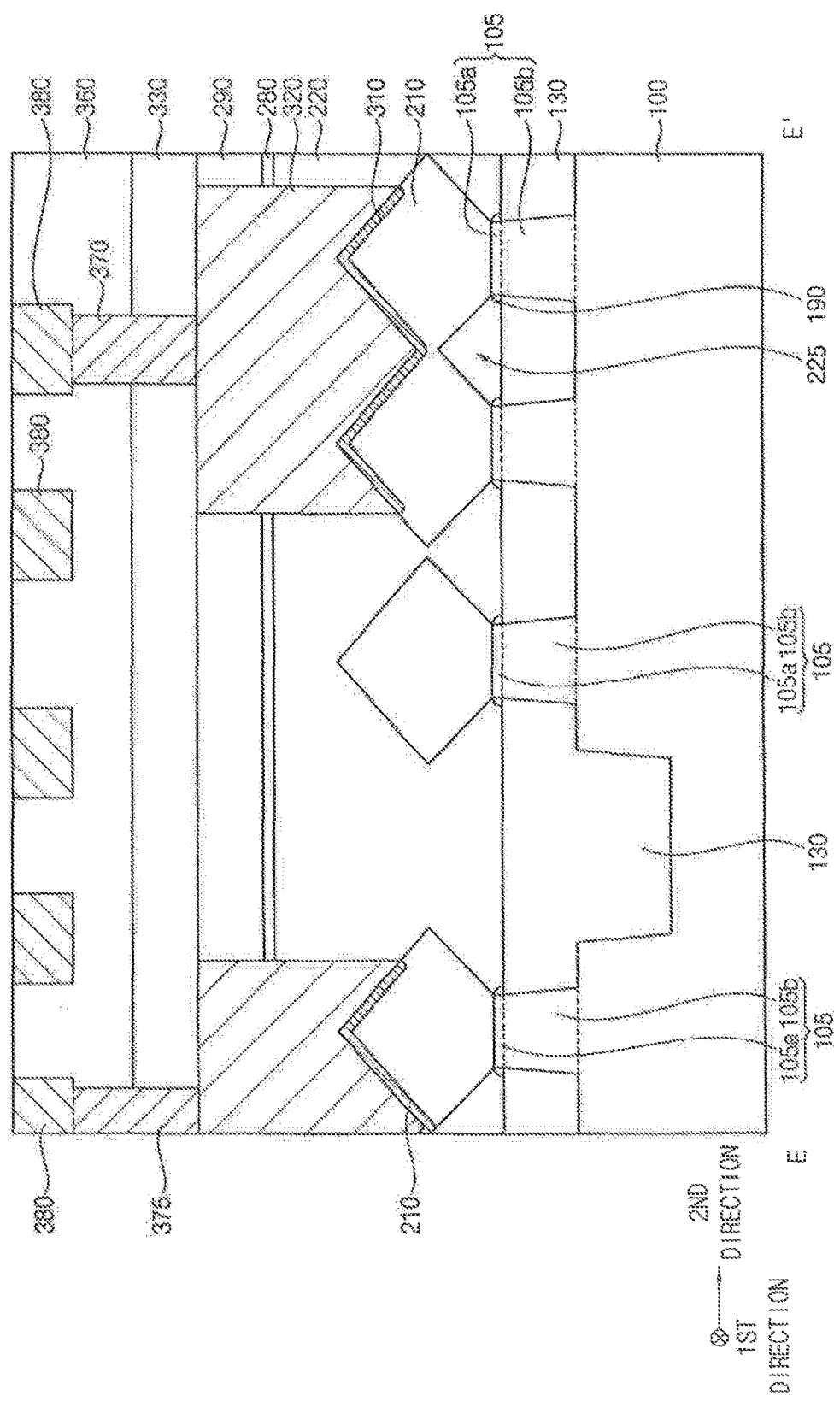

METHOD OF DESIGNING A LAYOUT OF A SEMICONDUCTOR DEVICE, AND A SEMICONDUCTOR DEVICE INCLUDING A FIN

CROSS-REFERENCE TO RELATED APPLICATION

This application claims priority under 35 USC § 119 to Korean Patent Application No. 10-2016-0171888, filed on Dec. 15, 2016 in the Korean Intellectual Property Office (KIPO), the disclosure of which is incorporated by reference herein in its entirety.

1. TECHNICAL FIELD

Exemplary embodiments of the present inventive concept relate to a method of designing a layout of a semiconductor device, and more particularly to a semiconductor device including a fin.

2. DISCUSSION OF RELATED ART

In a finFET, a portion of a gate structure on a field region may have a thickness greater than a portion of the gate structure on an active fin, and thus when a length of the portion of the gate structure on the field region is relatively long, the gate structure may fall down.

SUMMARY

An exemplary embodiment of the present inventive concept provides a semiconductor device including a more reliable finFET.

An exemplary embodiment of the present inventive concept provides a method of designing a layout of a semiconductor device including a finFET having increased reliability.

According to an exemplary embodiment of the present inventive concept, a semiconductor device includes active fins extending in a first direction. The active fins are arranged along a second direction crossing the first direction on a substrate. Gate lines each extend in the second direction. The gate lines are arranged along the first direction on the active fins. The semiconductor device includes contact plugs. At least one of the contact plugs is positioned on a respective one of the active fins. The semiconductor device includes first vias. At least one of the first vias is formed in a respective one of the first contact plugs. The semiconductor device includes first conductive lines. At least one of the first conductive lines overlaps a respective one of the first vias along a third direction orthogonal to the first and second directions. A first distance from a first active fin of the active fins on which a first gate line of the gate lines is formed to an end of the first gate line is more than a predetermined distance. A second distance from a second active fin of the active fins on which the first gate line is formed to the first active fin of the active fins is equal to or less than the predetermined distance. The second active fin is spaced apart from the first contact plugs to not overlap the first contact plugs along the third direction orthogonal to the first and second directions.

According to an exemplary embodiment of the present inventive concept, a semiconductor device includes active fins each extending in a first direction. The active fins are arranged along a second direction crossing the first direction on a substrate. Gate lines each extend in the second direction. The gate lines are arranged along the first direction on the active fins. The semiconductor device includes first contact plugs. At least one of the first contact plugs is positioned on a respective one of the active fins. The semiconductor device includes first vias. Each of the first vias is formed in a respective one of the first contact plugs. The semiconductor device includes first conductive lines. At least one of the first conductive lines overlaps a respective one of the first vias along a third direction orthogonal to the first and second directions. A first distance between two first active fins of the active fins on which a first gate line of the gate lines is formed is at least as long as a predetermined distance. A second distance from a second active fin of the active fins on which the first gate line is formed to each of the first active fins is less than the predetermined distance. The second active fin is positioned between the two first active fins along the second direction. The second active fin is spaced apart from the first contact plugs to not overlap the first contact plugs along the third direction orthogonal to the first and second directions.

According to an exemplary embodiment of the present inventive concept, a method of designing a layout of a semiconductor device includes designing a layout of a cell including active fins and gate lines crossing the active fins. If a first distance from an end of a first gate line of the gate lines to a first active fin of the active fins crossing the first gate line is more than a predetermined distance, the layout of the cell is changed such that a second active fin of the active fins not crossing the first gate line is extended to include an extended portion crossing the first gate line.

According to an exemplary embodiment of the present inventive concept, a method of designing a layout of a semiconductor device includes designing a layout of a cell including active fins and gate lines crossing the active fins. If a first distance between first active fins of the active fins crossing the first gate line is more than a predetermined distance, the layout of the cell is changed such that a second active fin of the active fins not crossing the first gate line is extended to cross the first gate line.

According to an exemplary embodiment of the present inventive concept, a method of designing a layout of a semiconductor device includes designing layouts of cells, each of the cells including active fins, gate lines crossing the active fins, and conductive lines. The layouts of the cells are arranged such that at least ones of the active fins, the gate lines, and the conductive lines of the respective cells are connected with each other. If a first distance from an end of a first gate line of the gate lines to a first active fin of the active fins crossing the first gate line is more than a predetermined distance, the layouts of the cells are changed such that a second active fin of the active fins not crossing the first gate line is extended to cross the first gate line.

According to an exemplary embodiment of the present inventive concept, a method of designing a layout of a semiconductor device includes designing layouts of cells, each of the cells including active fins, gate lines crossing the active fins, and conductive lines. The layouts of the cells are arranged such that at least ones of the active fins, the gate lines, and the conductive lines of the respective cells are connected with each other. If a first distance between first active fins of the active fins crossing a first gate line of the gate lines is more than a predetermined distance, the layouts of the cells are changed such that a second active fin of the active fins not crossing the first gate line is extended to cross the first gate line.

In the method of designing a semiconductor device, when a length of a portion of a dummy gate structure not contacting an active fin is more than a predetermined distance, an additional dummy active fin extending from the active fin may be formed to reduce the length, and thus the dummy gate structure need not fall down.

BRIEF DESCRIPTION OF THE DRAWINGS

The above and other features of the present inventive concept will become more apparent by describing in detail exemplary embodiments thereof with reference to the accompanying drawings, in which:

It will be understood that although the terms "first" and "second" may be used herein to describe various components, these components should not be limited by these terms.

FIGS. 7 to 35 are plan views and cross-sectional views illustrating a method of manufacturing a semiconductor device according to an exemplary embodiment of the present inventive concept.

DETAILED DESCRIPTION OF THE EMBODIMENTS

Figure 1:
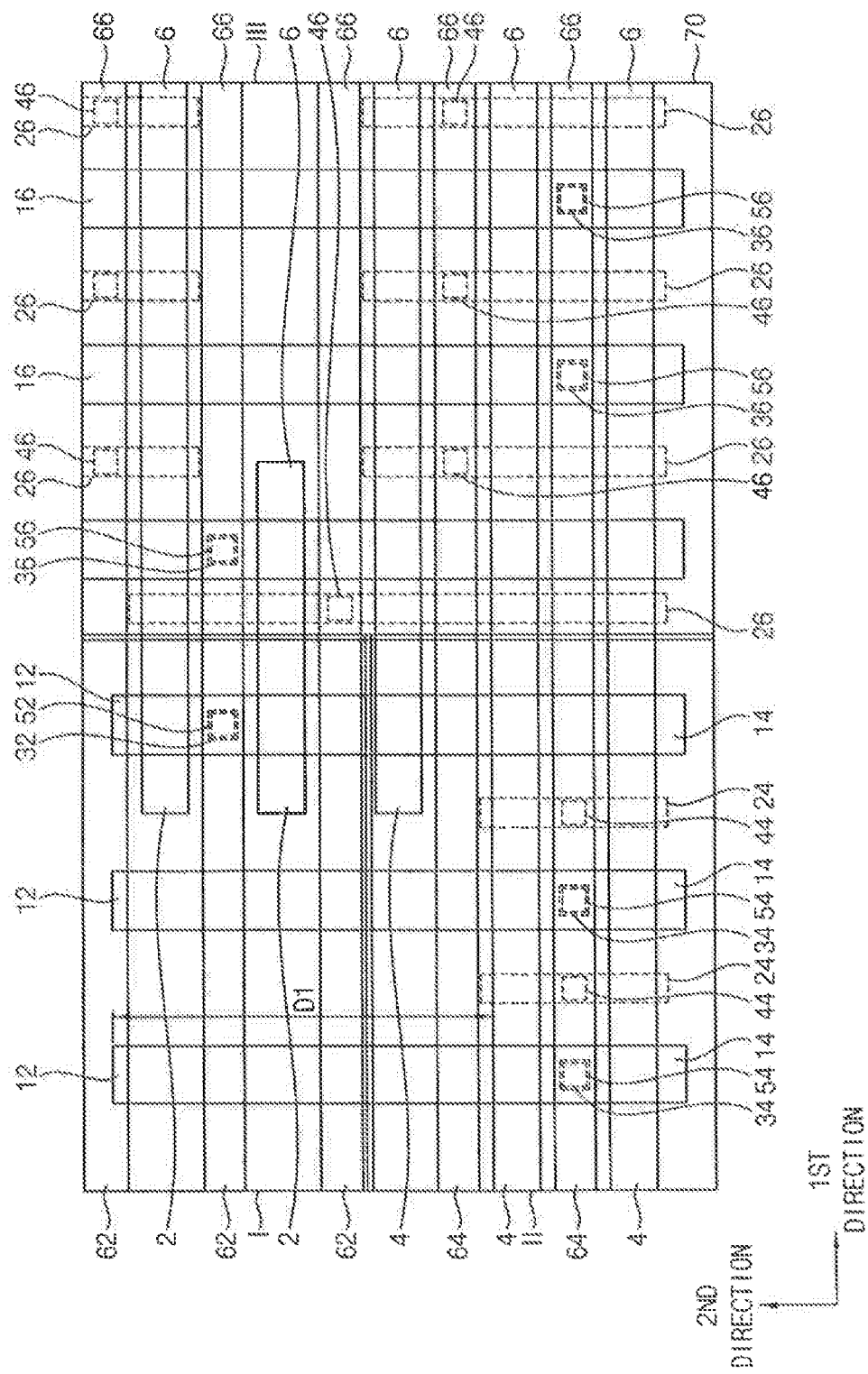
FIGS. 1 and 2 are plan views illustrating a method of designing a layout of a semiconductor device according to an exemplary embodiment of the present inventive concept.
Figure 2:
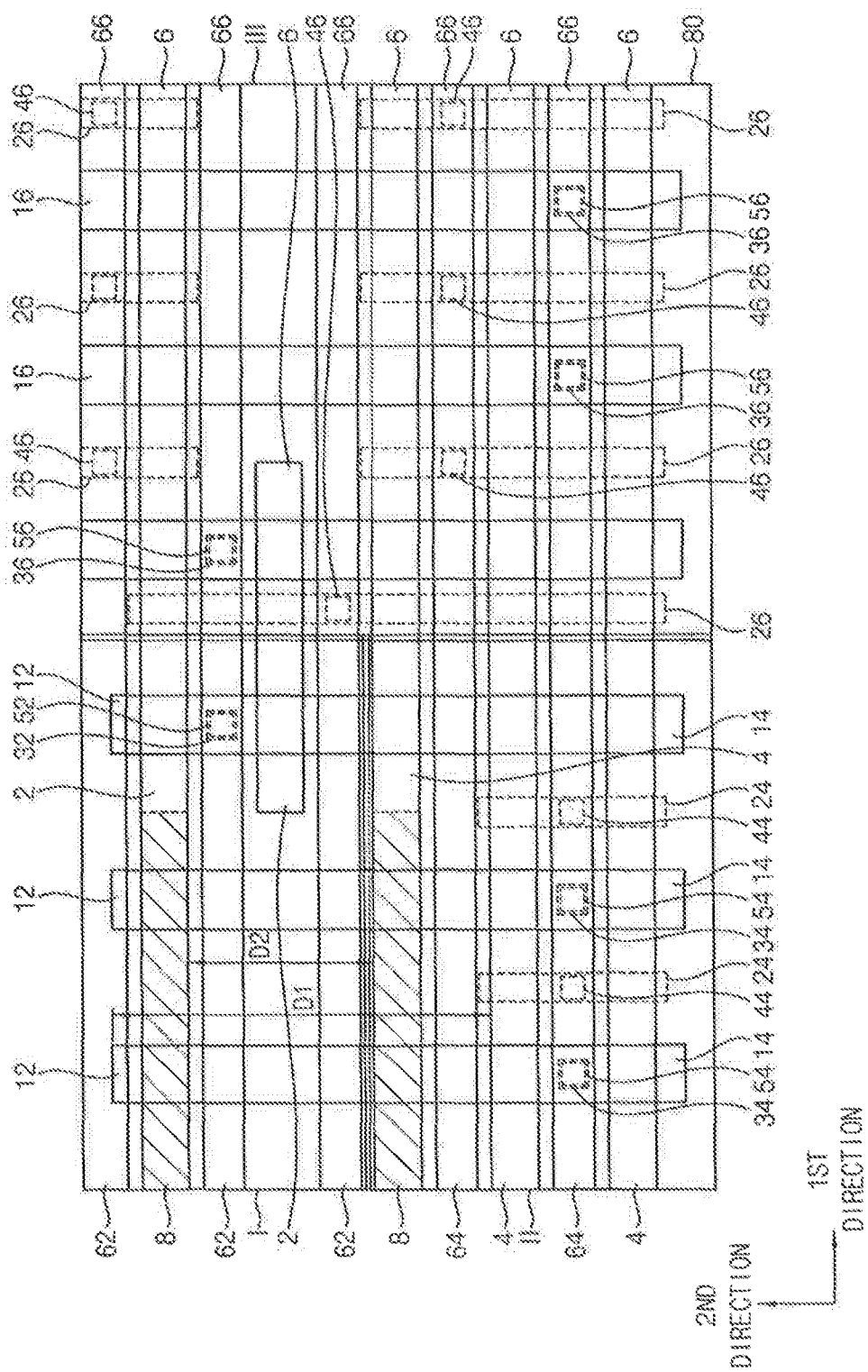

FIGS. 1 and 2 are plan views illustrating a method of designing a layout of a semiconductor device according to an exemplary embodiment of the present inventive concept.

Referring to FIG. 1, after designing layers including layouts of elements in first, second and third cells I, II and III of the semiconductor device, the layers may be arranged to overlap each other to form a first mask 70.

As an example, the layouts of the elements in the cells are described as one mask (e.g., the first mask 70); however, exemplary embodiments of the present inventive concept are not limited thereto. For example, a plurality of masks vertically overlapping with each other may be used for designing the layouts of the elements according to levels at which the elements are formed.

The number and arrangement of the elements in the cells described with reference to FIG. 1 are non-limitingly illustrative, and exemplary embodiments of the present inventive concept are not limited thereto. For example, the layout of the semiconductor including various elements and arrangements may be designed.

In an exemplary embodiment of the present inventive concept, the first mask 70 may include first, second and third active fins 2, 4 and 6, first, second and third gate lines 12, 14 and 16, second and third contact plugs 24 and 26, fourth, fifth and sixth contact plugs 32, 34 and 36, second and third vias 44 and 46, fourth, fifth and sixth vias 52, 54 and 56, and first, second and third conductive lines 62, 64 and 66.

The first active fin 2, the first gate line 12, the fourth contact plug 32, the fourth via 52, and the first conductive line 62 may be disposed in the first cell I. The second active fin 4, the second gate line 12, the second contact plug 24, the fifth contact plug 34, the second via 44, the fifth via 54, and the second conductive line 64 may be disposed in the second cell II. The third active fin 6, the third gate line 16, the third contact plug 26, the sixth contact plug 36, the third via 46, the sixth via 56, and the third conductive line 66 may be disposed in the third cell III.

Each of the first to third active fins 2, 4 and 6 may extend in a first direction, and a plurality of first active fins 2, a plurality of second active fins 4, and a plurality of third active fins 6 may extend in a second direction crossing the first direction. In an exemplary embodiment of the present inventive concept, the first and second directions may be substantially perpendicular to each other. The first and third active fins 2 and 6 may be connected with each other at an area at which the first and third cells I and II meet each other, and the second and third active fins 4 and 6 may be connected with each other at an area at which the second and third cells II and III meet each other.

Each of the first to third gate lines 12, 14 and 16 may extend in the second direction. For example, a plurality of first gate lines 12, a plurality of second gate lines 14, and a plurality of third gate lines 16 extending in the second direction may be arranged along the first direction. The first and second gate lines 12 and 14 may be connected with each other at an area at which the first and second cells I and II meet each other.

Each of the second and third contact plugs 24 and 26 may extend in the second direction. For example, a plurality of second contact plugs 24 and a plurality of third contact plugs 26 extending in the second direction may be arranged along the first direction. In an exemplary embodiment of the present inventive concept, the second contact plug 24 may be positioned between adjacent second gate lines 14 of the plurality of second gate lines 14, and the third contact plugs 26 may be positioned between adjacent third gate lines 16 of the plurality of third gate lines 16.

The fourth to sixth contact plugs 32, 34 and 36 may overlap the first to third gate lines 12, 14 and 16, respectively along a direction orthogonal to the first and second directions.

The second and third vias 44 and 46 may overlap the second and third contact plugs 24 and 26, respectively along a direction orthogonal to the first and second directions.

The fourth to sixth vias 52, 54 and 56 may overlap the fourth to sixth contact plugs 32, 34 and 36, respectively along a direction orthogonal to the first and second directions.

Each of the first to third conductive lines 62, 64 and 66 may extend in the first direction. A plurality of first conductive lines 62, a plurality of second conductive lines 64, and a plurality of third conductive lines 66 extending in the first direction may be arranged along the second direction. The first and third conductive lines 62 and 66 may be connected with each other at an area at which the first and third cells I and III meet each other. The second and third conductive lines 64 and 66 may be connected with each other at an area at which the second and third cells II and III meet each other.

In an exemplary embodiment of the present inventive concept, a first conductive line 62 of the conductive lines 62 may be positioned between adjacent first active fins 2 of the first active fins 2. A second conductive line 64 of the second conductive lines 64 may be positioned between adjacent second active fins 4 of the second active fins 4. A third conductive line 66 of the third conductive lines 66 may be positioned between adjacent third active fins 6 of the third active fins 6; however, exemplary embodiments of the present inventive concept are not limited thereto.

Each of the second to sixth vias 44, 46, 52, 54 and 56 may overlap one of the first to third conductive lines 62, 64 and 66 along a direction orthogonal to the first and second directions.

In an exemplary embodiment of the present inventive concept, a first distance D1 along the first direction from an end of a first gate line 12 of the first gate lines 12 not overlapping the first active fin 2 to a closest one of the second active fins 4 overlapping the second gate line 14 and connected to the first one of the first gate lines 12 may not be more than a predetermined distance.

No contact or via may overlap a portion of the first gate line 12 of the first gate lines 12 not overlapping the first active fin 2 along a direction orthogonal to the first and second directions between the end of the first gate line 12 of the first gate lines 12 and the closest one of the second active fins 4.

Referring to FIG. 2, a second mask 80 further including a layout of a fourth active fin 8 may be designed.

In an exemplary embodiment of the present inventive concept, the fourth active fin 8 may extend from the first active fin 2 or the second active fin 4 in the first direction, and may overlap at least one of the first gate lines 12. FIG. 2 shows two fourth active fins 8; however, exemplary embodiments of the present inventive concept are not limited thereto. For example, one or three fourth active fins 8 may be may be included in the second mask 80.

In an exemplary embodiment of the present inventive concept, a second distance D2 along the first direction between the fourth active fins 8 extending from the respective first and second active fins 2 and 4 in the first direction may be equal to or less than the predetermined distance described above with reference to the first distance D1. When only one fourth active fin 8 is disposed, a distance between the second active fin 4 and the fourth active fin 8 may be equal to or less than the predetermined distance.

Layouts of the first, second and third cells I, II and III including the active fins 2, 4 and 6, the gate lines 12, 14 and 16 crossing the active fins 2, 4 and 6, and the conductive lines 62, 64 and 66 may be designed. The layouts of the first, second and third cells I, II and III may be arranged such that at least portions of the active fins 2, 4 and 6, the gate lines 12, 14 and 16, and the conductive lines 62, 64 and 66 may be connected with each other.

When the first distance D1 from the end of the first gate line 12 among the first to third gate lines 12, 14 and 16 to the second active fin 4 among the first to third active fins 2, 4 and 6 crossing the second gate line 14 and connected to the first gate line 12, (i.e., extension lengths of the first and second gate lines 12 and 14 along the second direction from the second active fin 4 not overlapping active fins) is at least as long as the predetermined distance described above with reference to D1, the first active fin 2 and/or the second active fin 4 among the first to third active fins 2, 4 and 6 not crossing the first gate line 12 may extend to form the fourth active fin 8. Thus, the layouts of the cells I, II and III may be changed so that the fourth active fin 8 may cross the first gate line 12, which may be referred to as a first change of the layouts. By the first change of layouts, the second distance D2 between the fourth active fins 8 (i.e., extension lengths of the first and second gate lines 12 and 14 along the second direction between the fourth active fins 8) may be equal to or less than the predetermined distance.

If elements of the cells I, II and III are formed on a substrate according to the layouts thereof before the first change of layouts, the extension lengths of the first and second gate lines 12 and 14 from the second active fin 4 may be relatively long, and thus may fall down. However, when the elements of the cells I, II and III are formed on the substrate according to the layouts thereof after the first change of layouts, the extension lengths of the first and second gate lines 12 and 14 from the second active fin 4 may be reduced by the addition of the fourth active fins 8, and thus need not fall down.

The layouts of the cells I, II and III may include the second and third contact plugs 24 and 26, the fourth to sixth contact plugs 32, 34 and 36, the second and third vias 44 and 46, and the fourth to sixth vias 52, 54 and 56. Contact plugs and vias might not overlap extension portions of the first and second gate lines 12 and 14 from the second active fin 4 to the end of the first gate line 12 along the first distance D1.

In an exemplary embodiment of the present inventive concept, after the first change of layouts, the layouts may be further changed through checking design rules, which may be referred to as a second change of layouts. However, during the second change of layouts, contact plugs and vias might not overlap extension portions of the first and second gate lines 12 and 14 between the fourth active fins 8.

The fourth active fins 8 may prevent the first and second gate lines 12 and 14 from falling down. Electrical signals might not be applied to the fourth active fins 8. Additionally, electrical signals might not be applied to portions of the first and second gate lines 12 and 14 overlapping the fourth active fins 8. Thus, contact plugs and vias might not be formed in those areas, which may be a design rule for the layout of the semiconductor device in the second change of layouts.

Figure 3:
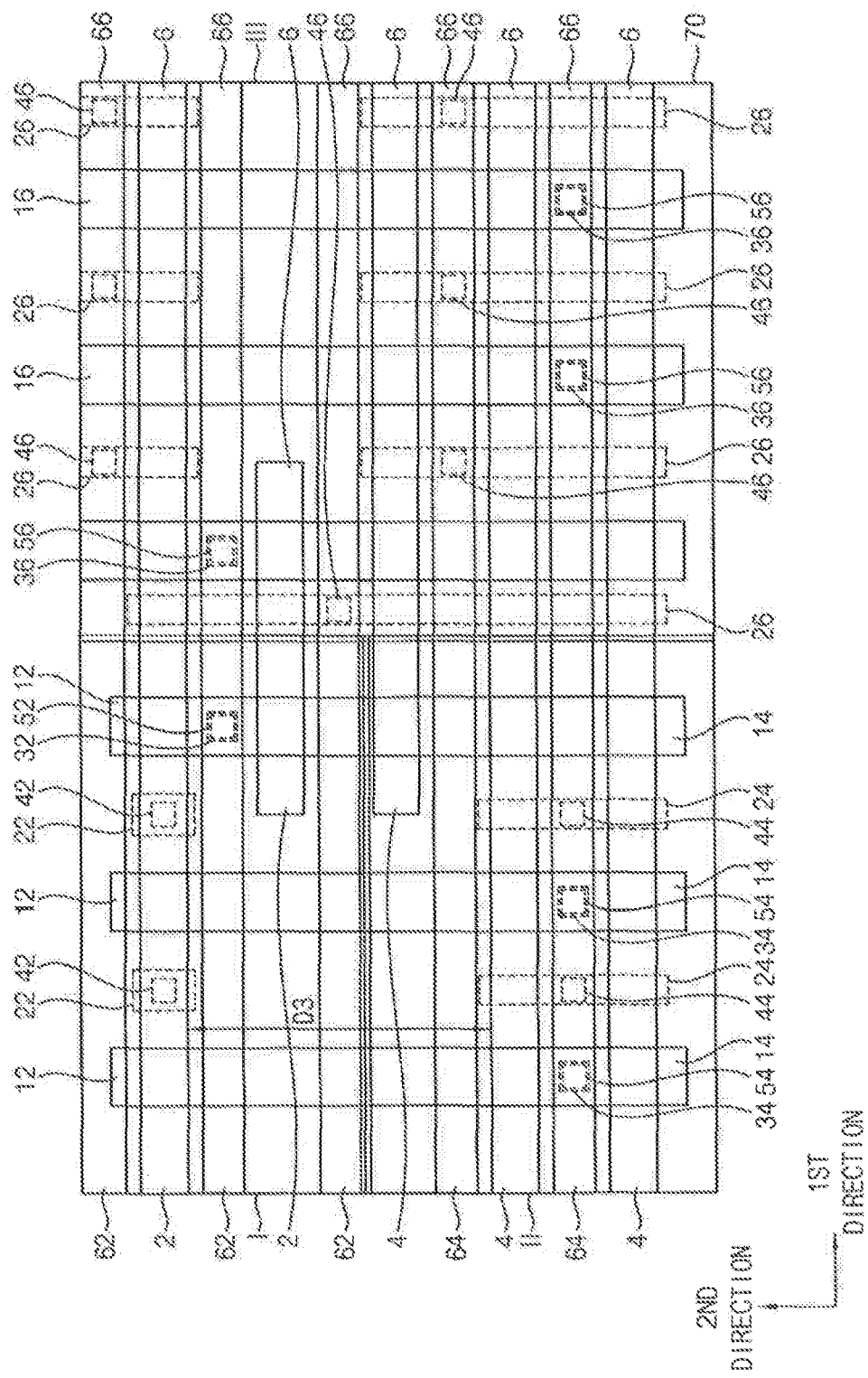
FIGS. 3 and 4 are plan views illustrating a method of designing a layout of a semiconductor device according to an exemplary embodiment of the present inventive concept.
Figure 4:
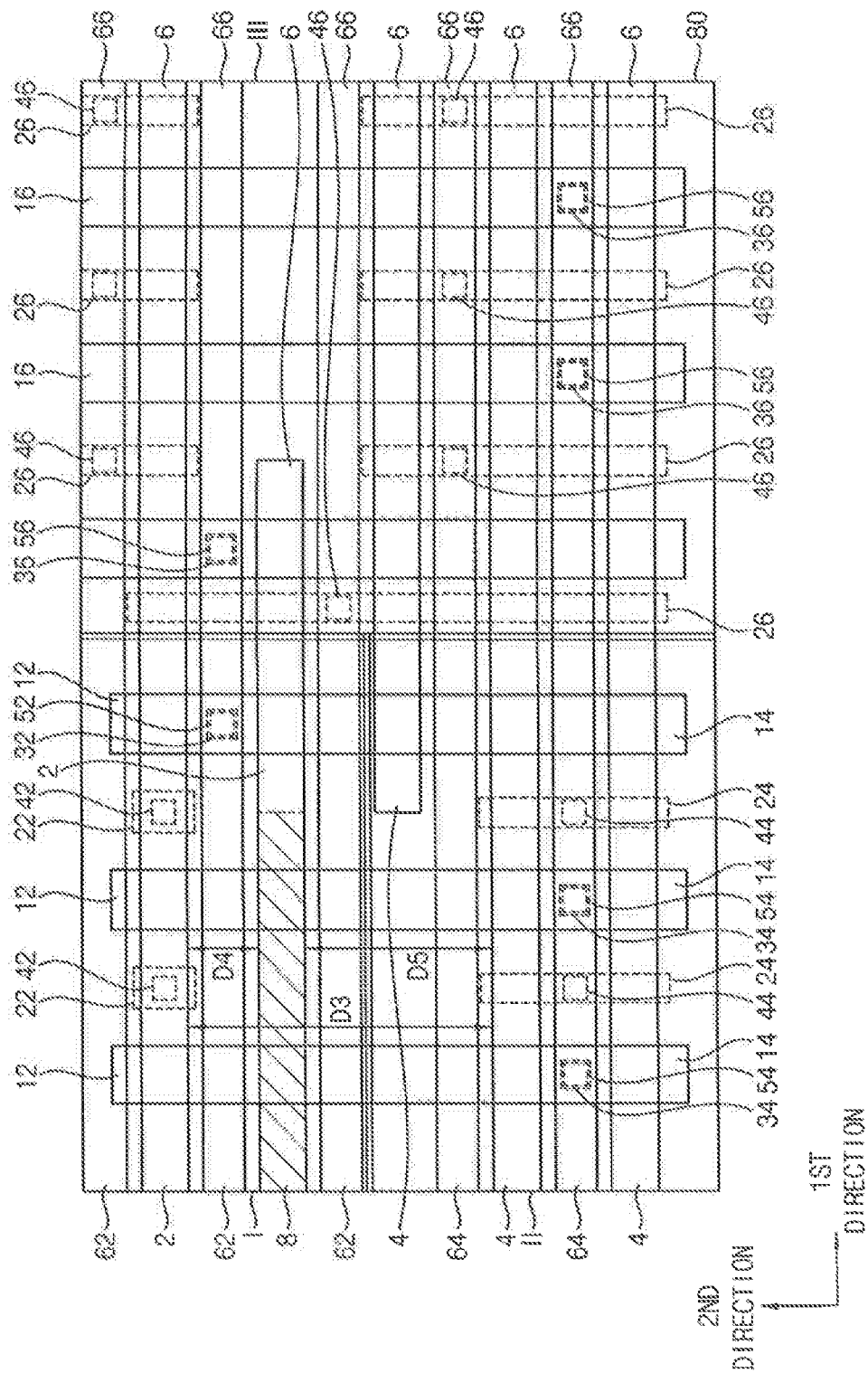

FIGS. 3 and 4 are plan views illustrating a method of designing a layout of a semiconductor device according to an exemplary embodiment of the present inventive concept. FIGS. 3 and 4 are similar to FIGS. 1 and 2, and thus like reference numerals refer to like elements, and duplicative descriptions may be omitted below.

Referring to FIG. 3, after designing layers including layouts of elements in the first to third cells I, II and III of the semiconductor device, the layers may be arranged to overlap each other to form the first mask 70.

A first active fin 2 of the first active fins 2 may extend in the first direction to overlap the first gate lines 12 in the first cell I. A third distance D3 between the first active fin 2 and a closet one of the second active fins 4 in the second cell II might not be more than a predetermined distance.

A first contact plug 22 and a first via 42 may overlap portions of the first active fin 2 at opposite sides, respectively, of the first gate line 12 along a direction orthogonal to the first and second directions.

Referring to FIG. 4, the second mask 80 further including the fourth active fin 8 may be designed.

In an exemplary embodiment of the present inventive concept, the fourth active fin 8 may extend from a first active fin 2 of the first active fins 2 in the first direction, and may overlap the first gate line 12. FIG. 4 shows one fourth active fin 8; however, exemplary embodiments of the present inventive concept are not limited thereto.

In an exemplary embodiment of the present inventive concept, a fourth distance D4 between the first and fourth active fins 2 and 8, and a fifth distance D5 between the second and fourth active fins 4 and 8 may be equal to or less than the predetermined distance described above with reference to distance D3.

Layouts of the semiconductor device may be changed, which may be referred to as the first change of layouts, so that the extension lengths of portions of the first and second gate lines 12 and 14 not overlapping active fins may be reduced to be equal to or less than the predetermined distance, and thus the first and second gate lines 12 and 14 may be formed on a substrate without falling down.

The layouts of the cells I, II and III may include the first to third contact plugs 22, 24 and 26, the fourth to sixth contact plugs 32, 34 and 36, the first to third vias 42, 44 and 46, and the fourth to sixth vias 52, 54 and 56. However, contact plugs and vias might not overlap extension portions of the first and second gate lines 12 and 14 between the first and second active fins 2 and 4 along a direction orthogonal to the first and second directions.

After the first change of layouts, the layouts may be further changed through checking design rules, which may be referred to as the second change of layouts. However, during the second change of layouts, contact plugs and vias may overlap extension portions of the first and second gate lines 12 and 14 between the fourth active fin 8 and the first and second active fins 2 and 4 along a direction orthogonal to the first and second directions.

Figure 5:
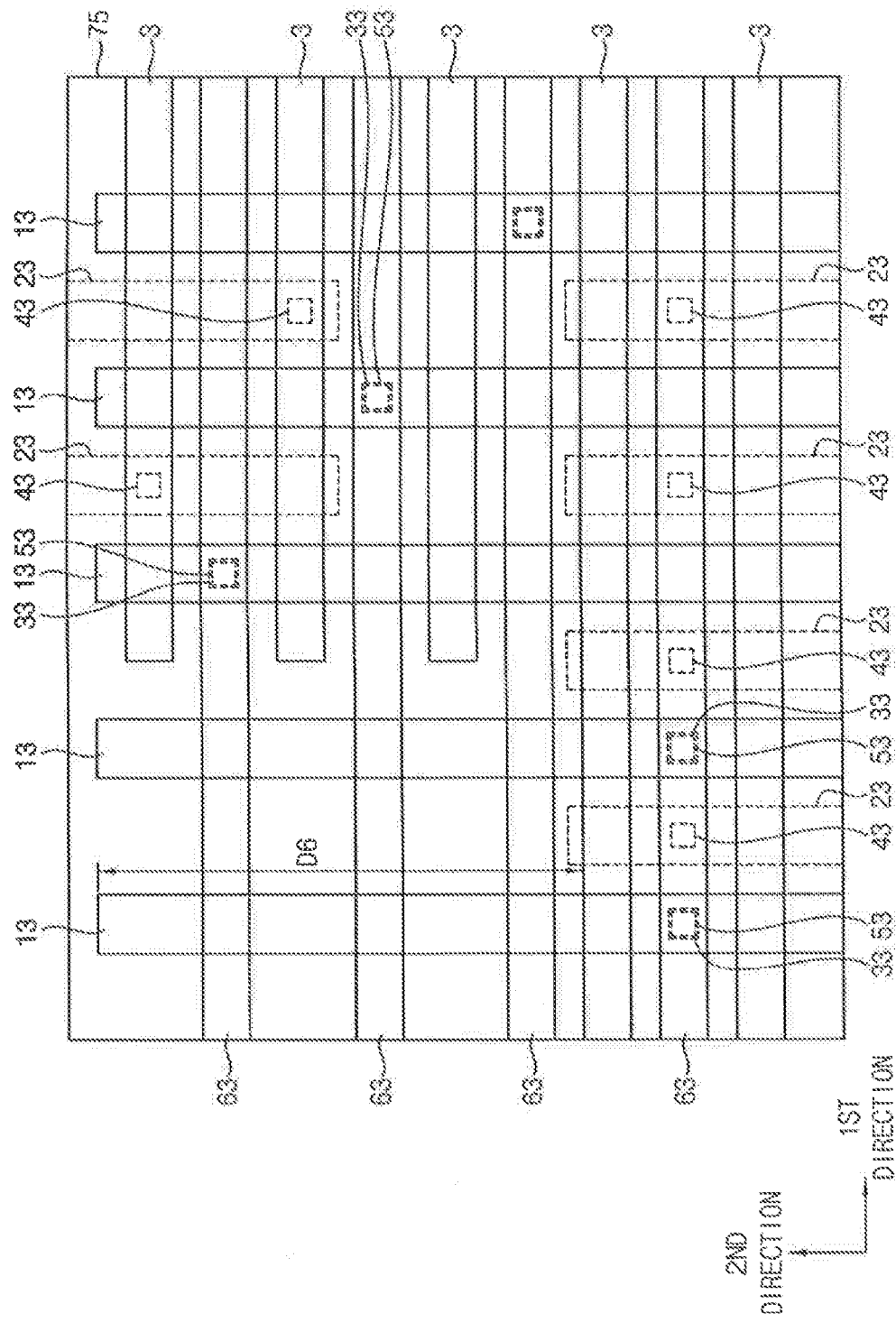
FIGS. 5 and 6 are plan views illustrating a method of designing a layout of a semiconductor device according to an exemplary embodiment of the present inventive concept.
Figure 6:
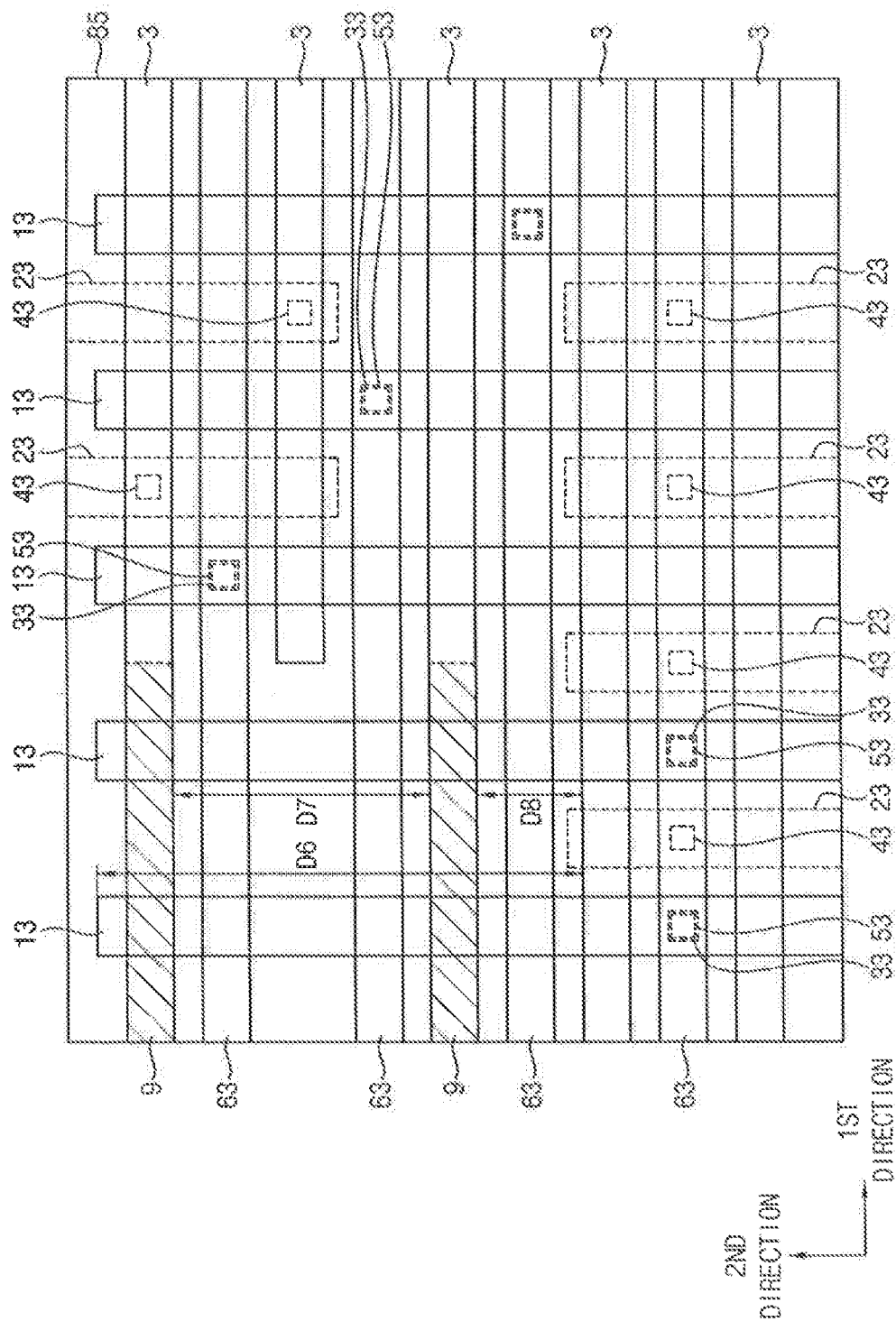

FIGS. 5 and 6 are plan views illustrating a method of designing a layout of a semiconductor device according to an exemplary embodiment of the present inventive concept.

Referring to FIG. 5, a third mask 75 including layouts of elements of a cell of the semiconductor device may be designed.

The third mask 75 may include a fifth active fin 3, a fourth gate line 13, a seventh contact plug 23, an eighth contact plug 33, a seventh via 43, an eighth via 53, and a fourth conductive line 63.

The fifth active fin 3 may extend in the first direction. A plurality of fifth active fins 3 may be arranged along the second direction. The fourth gate line 13 may extend in the second direction. A plurality of fourth gate lines 13 may be arranged along the first direction. The seventh contact plug 23 may extend in the second direction, and may be disposed between adjacent fourth gate lines 13 of the fourth gate lines 13. The eighth contact plug 33 may overlap the fourth gate line 13 along a direction orthogonal to the first and second directions. The seventh via 43 may overlap the eighth contact plug 33 along a direction orthogonal to the first and second directions. The eighth via 53 may overlap the eighth contact plug 33 along a direction orthogonal to the first and second directions. The fourth conductive line 63 may extend in the first direction. A plurality of fourth conductive lines 63 may be arranged along the second direction. Each of the seventh and eighth vias 43 and 53 may overlap one of the fourth conductive lines 63 along a direction orthogonal to the first and second directions.

In an exemplary embodiment of the present inventive concept, a sixth distance D6 from an end of a second one of the fourth gate lines 13 not overlapping the fifth active fin 3 to a closest one of the fifth active fins 3 overlapping the second one of the fourth gate lines 13 may be more than a predetermined distance.

Contact plugs and vias might not overlap a portion of the second one of the fourth gate lines 13 between the end of the second one of the fourth gate lines 13 and the closest one of the fifth active fin 3.

Referring to FIG. 6, a fourth mask 85 further including a sixth active fin 9 may be designed.

In an exemplary embodiment of the present inventive concept, the sixth active fin 9 may extend from the fifth active fin 3 in the first direction, and may overlap the fourth gate line 13. FIG. 6 shows two sixth active fins 9; however, exemplary embodiments of the present inventive concept are not limited thereto.

In an exemplary embodiment of the present inventive concept, a seventh distance D7 between the sixth active fins 9, and an eighth distance D8 between the fifth and sixth active fins 3 and 9 may be equal to or less than the predetermined distance described above with reference to distance D6.

Layouts of the semiconductor device may be changed so that an extension length of the fourth gate line 13 overlapping active fins may be reduced to be equal to or less than the predetermined distance, and thus the fourth gate line 13 may be formed on a substrate without falling down.

Contact plugs and vias may overlap extension portions of the fourth gate line 13 between the sixth active fins 9, on the sixth active fin 9, and between the fifth and sixth active fins 3 and 9 along a direction orthogonal to the first and second directions.

Even in the process of designing a layout of each cell, if the extension portion of the fourth gate line 13 not overlapping the fifth active fin 3 is relatively long, the sixth active fin 9 extending from the fifth active fin 3 may be added, so that the fourth gate line 13 may be formed on a substrate without falling down.

Referring to FIGS. 1 to 4, even after designing and arranging the layouts of the cells I, II and III, the first change and/or second change of layouts may be further performed to the layouts described with reference to FIGS. 5 and 6.

Figure 29:
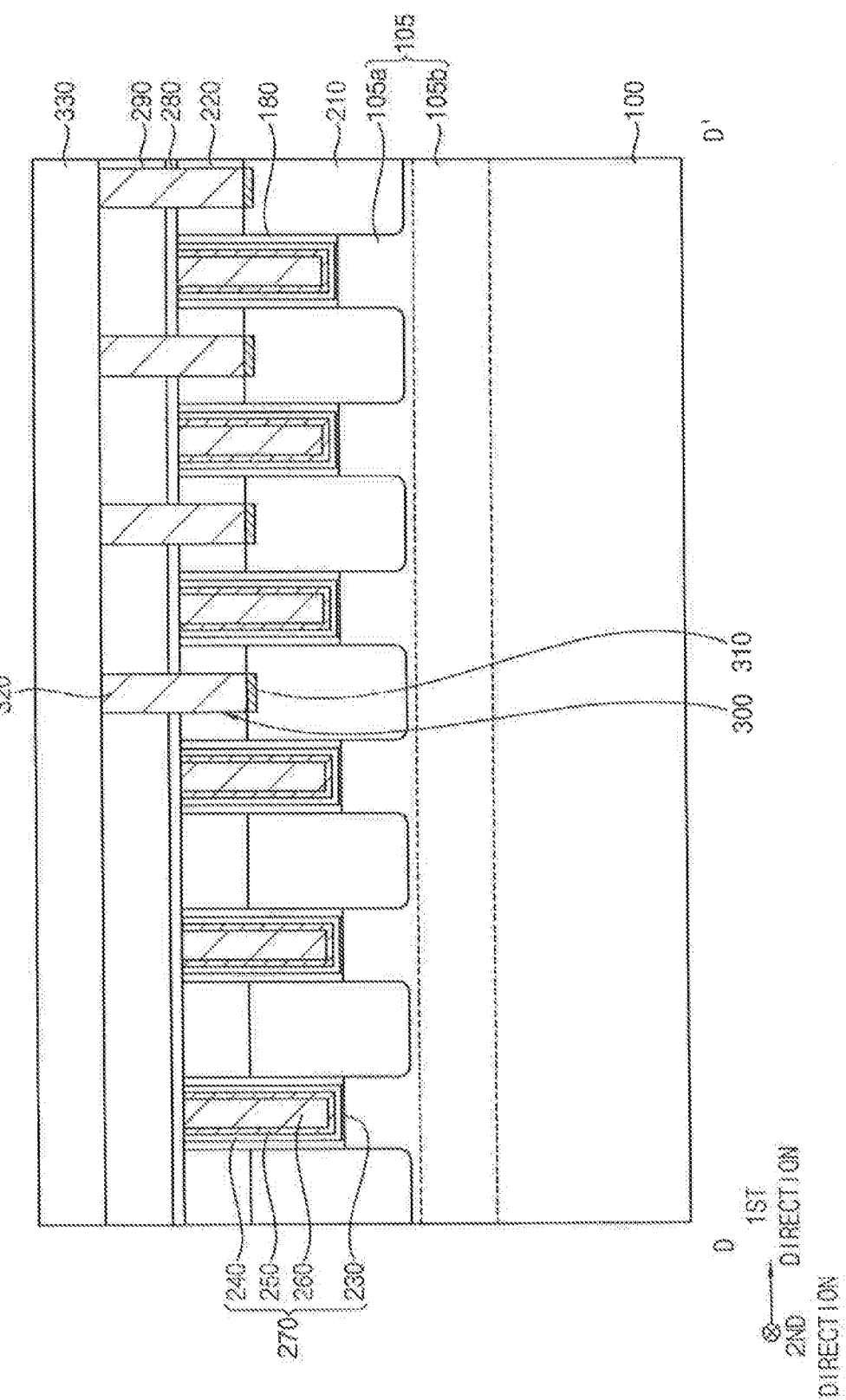
Figure 30:
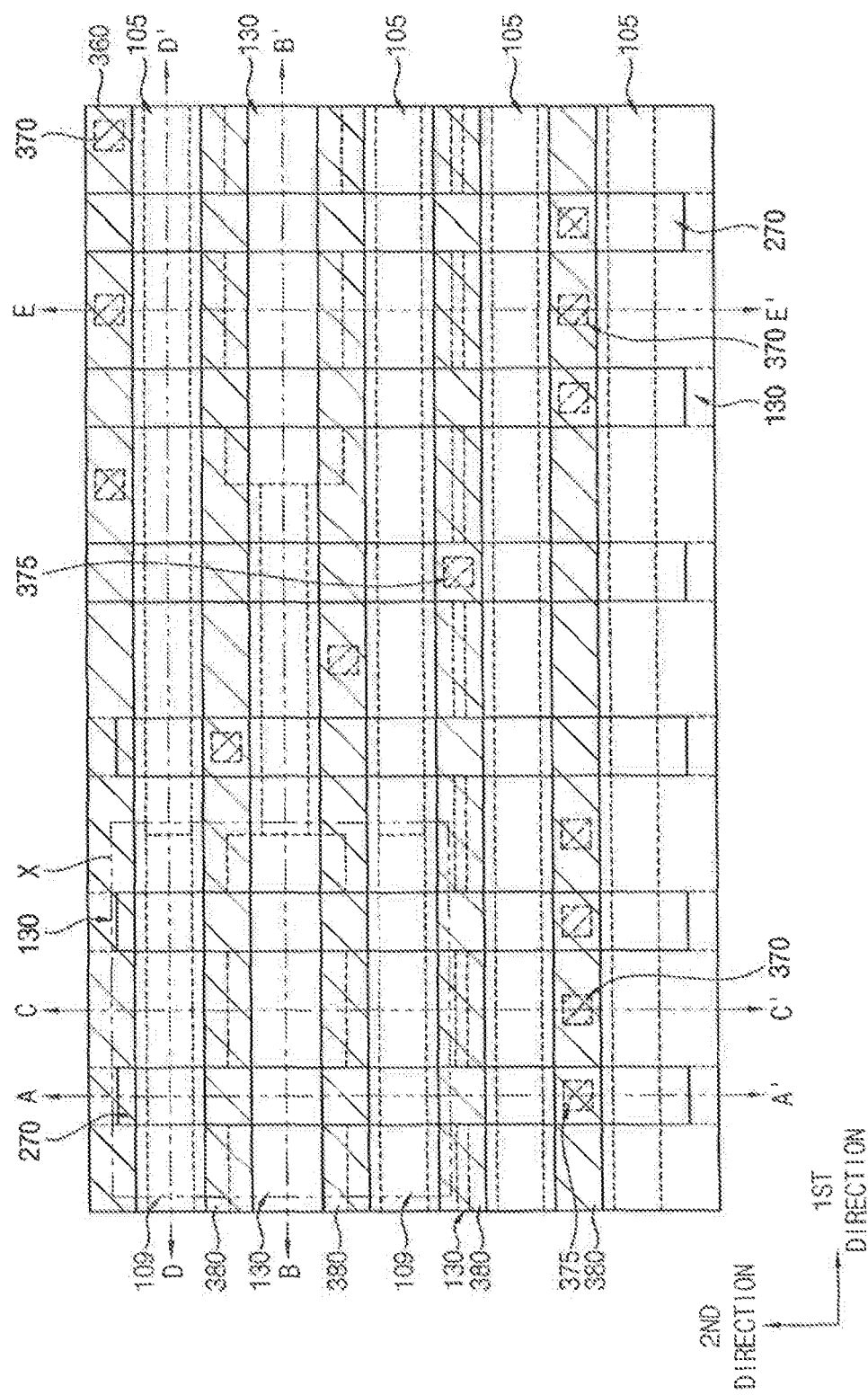
Figure 31:
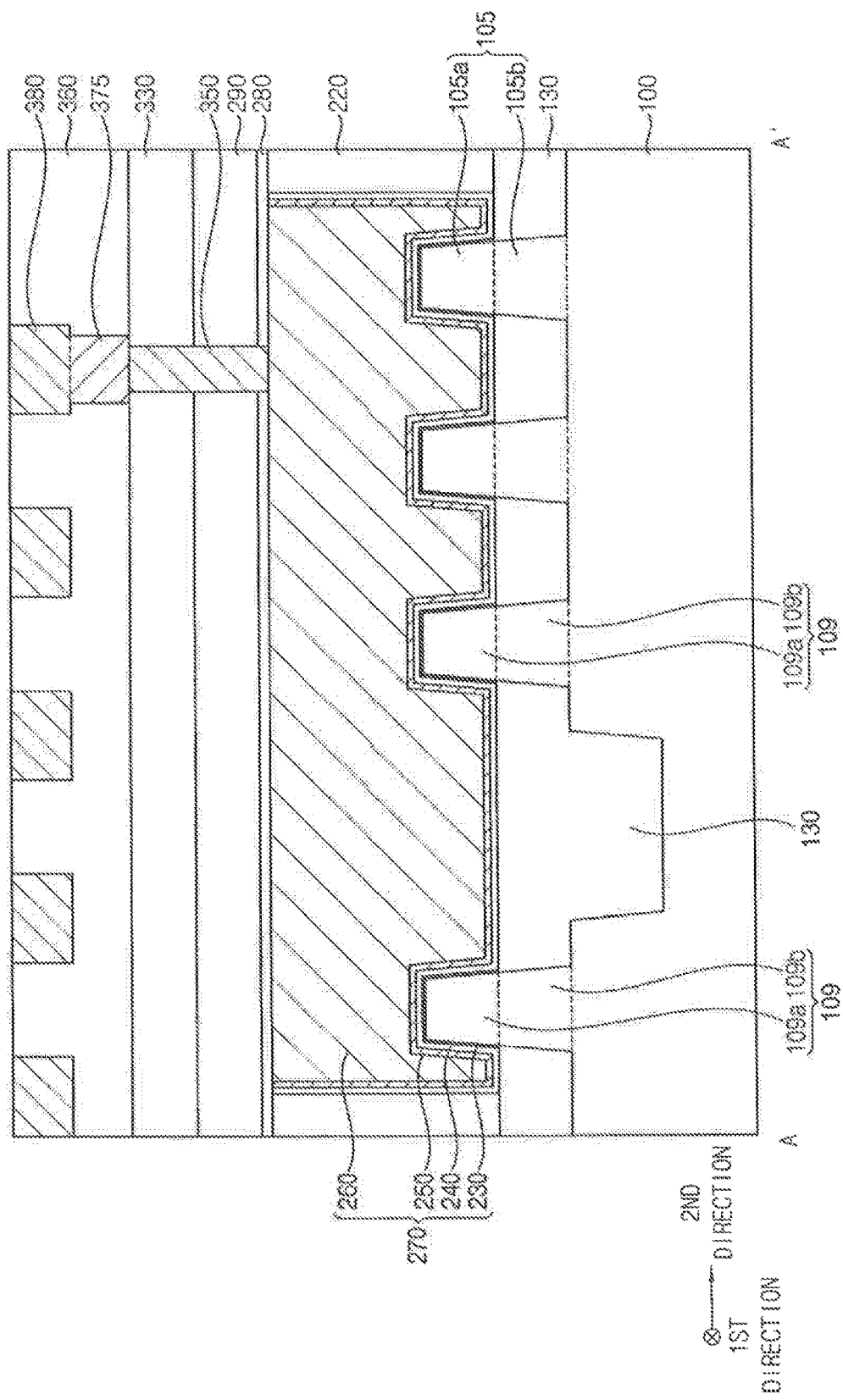
Figure 32:
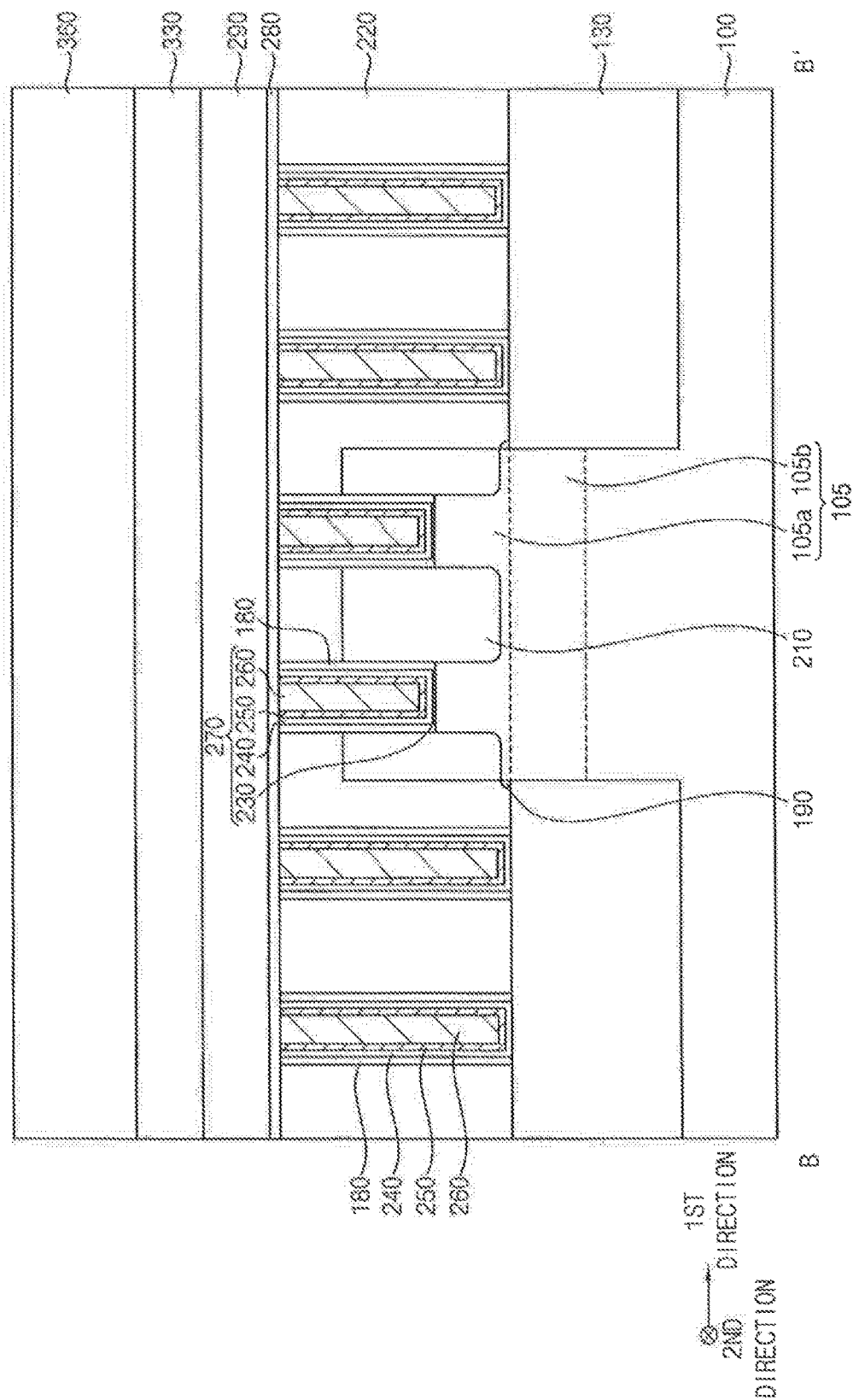
Figure 33:
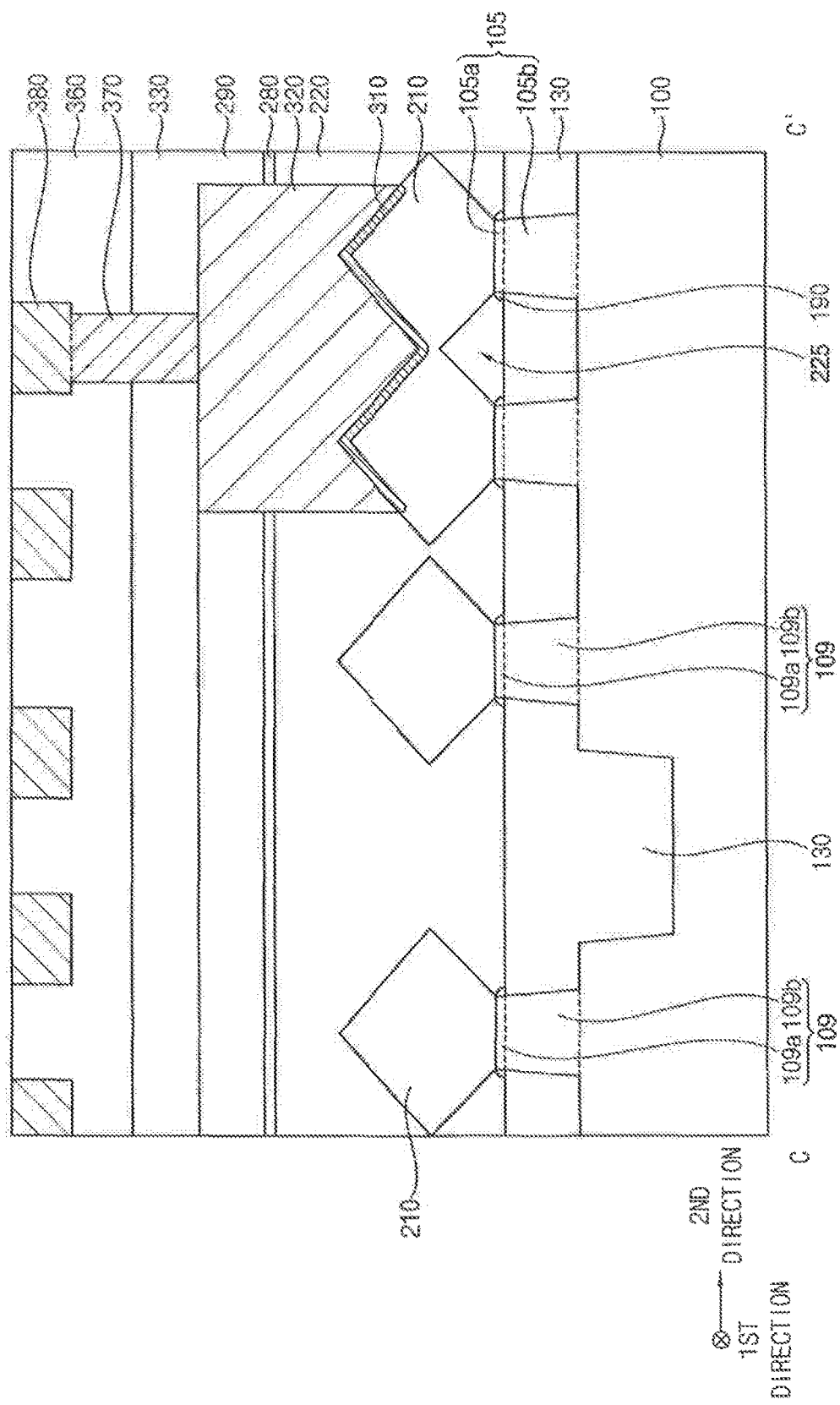
Figure 34:
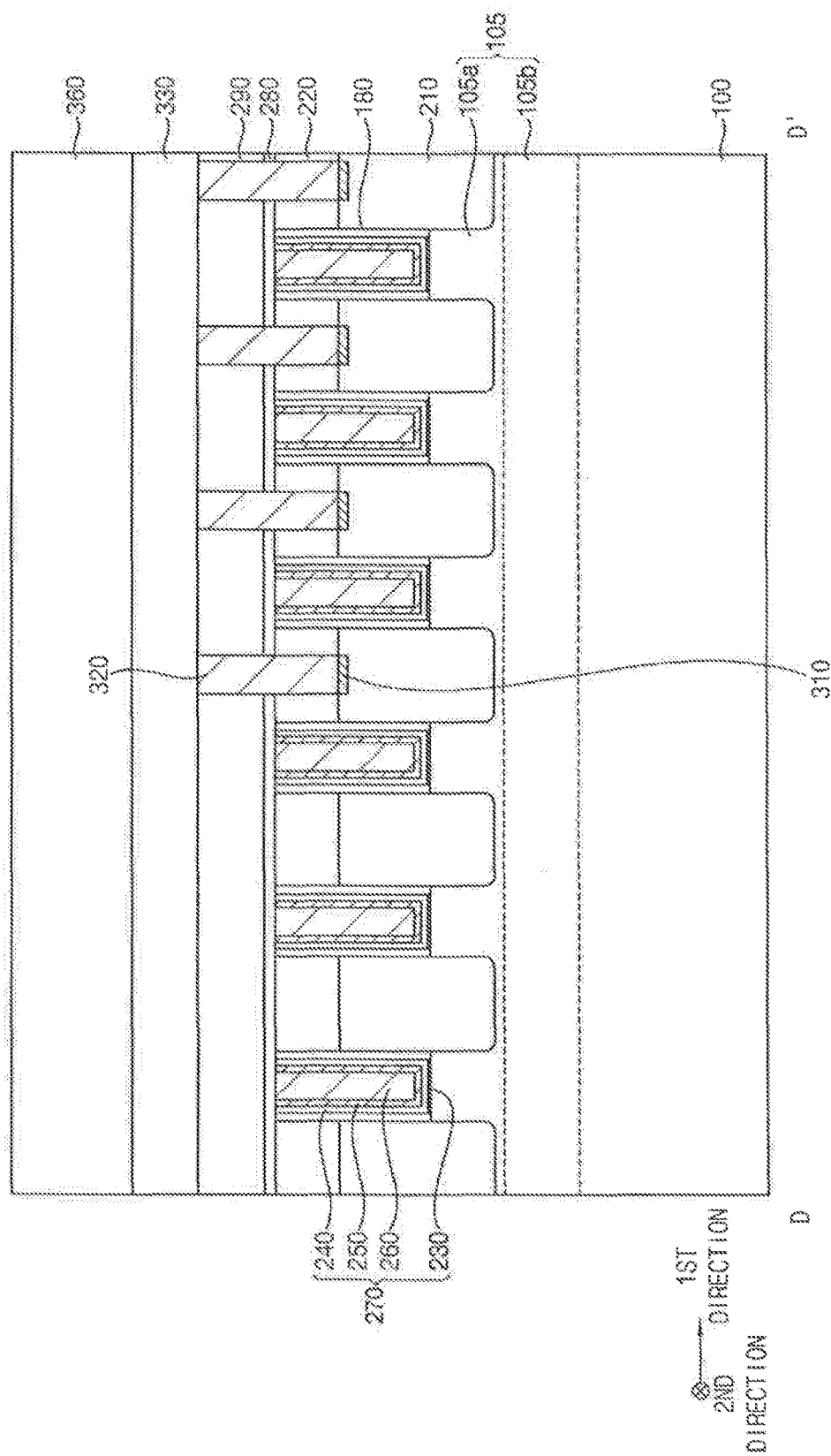

FIGS. 7 to 35 are plan views and cross-sectional views illustrating a method of manufacturing a semiconductor device according to an exemplary embodiment of the present inventive concept. FIGS. 7, 9, 11, 13, 16, 19, 22, 26 and 30 are plan views. FIGS. 8, 10, 12, 14-15, 17-18, 20-21, 23-25, 27-29 and 31-35 are cross-sectional views. FIGS. 8, 10, 12, 14, 23, 27 and 31 are cross-sectional views taken along lines A-A' of corresponding plan views, respectively. FIGS. 15, 17, 20, 24 and 32 are cross-sectional views taken along lines B-B' of corresponding plan views, respectively. FIGS. 18, 21, 25, 28 and 33 are cross-sectional views taken along lines C-C' of corresponding plan views, respectively. FIGS. 29 and 34 are cross-sectional views taken along lines D-D' of corresponding plan views, respectively. FIG. 35 is a cross-sectional view taken along a line E-E' of a corresponding plan view.

The method according to an exemplary embodiment of the present inventive concept described with reference to FIGS. 7 to 35 may include the method of designing the layout of the semiconductor device described above with reference to FIGS. 1 and 2, and thus duplicative descriptions may be omitted. The method according to an exemplary embodiment of the present inventive concept described with reference to FIGS. 7 to 35 may include the method of designing the layout of the semiconductor device described above with reference to FIGS. 3 and 4, or FIGS. 5 and 6.

Figure 7:
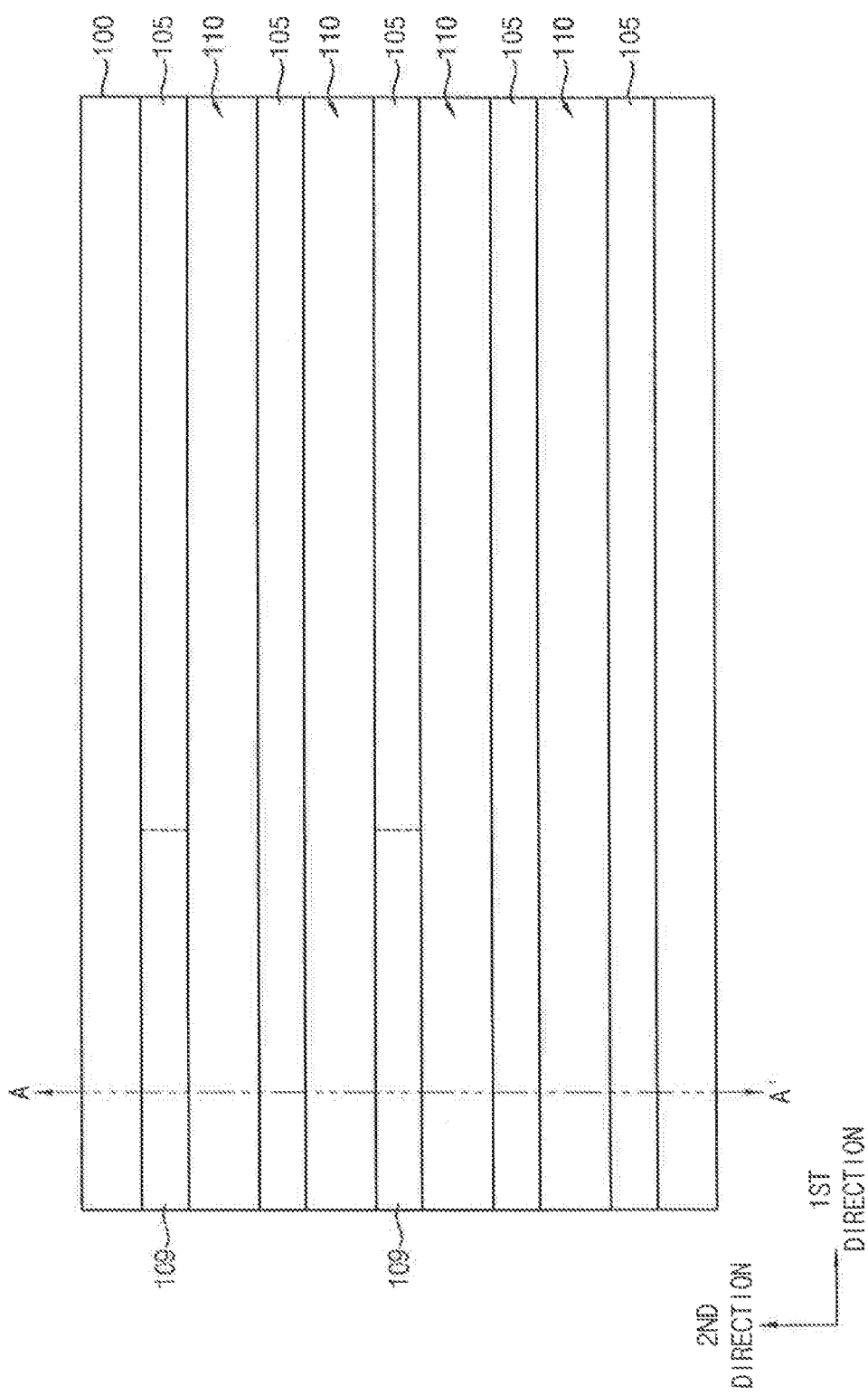
Figure 8:
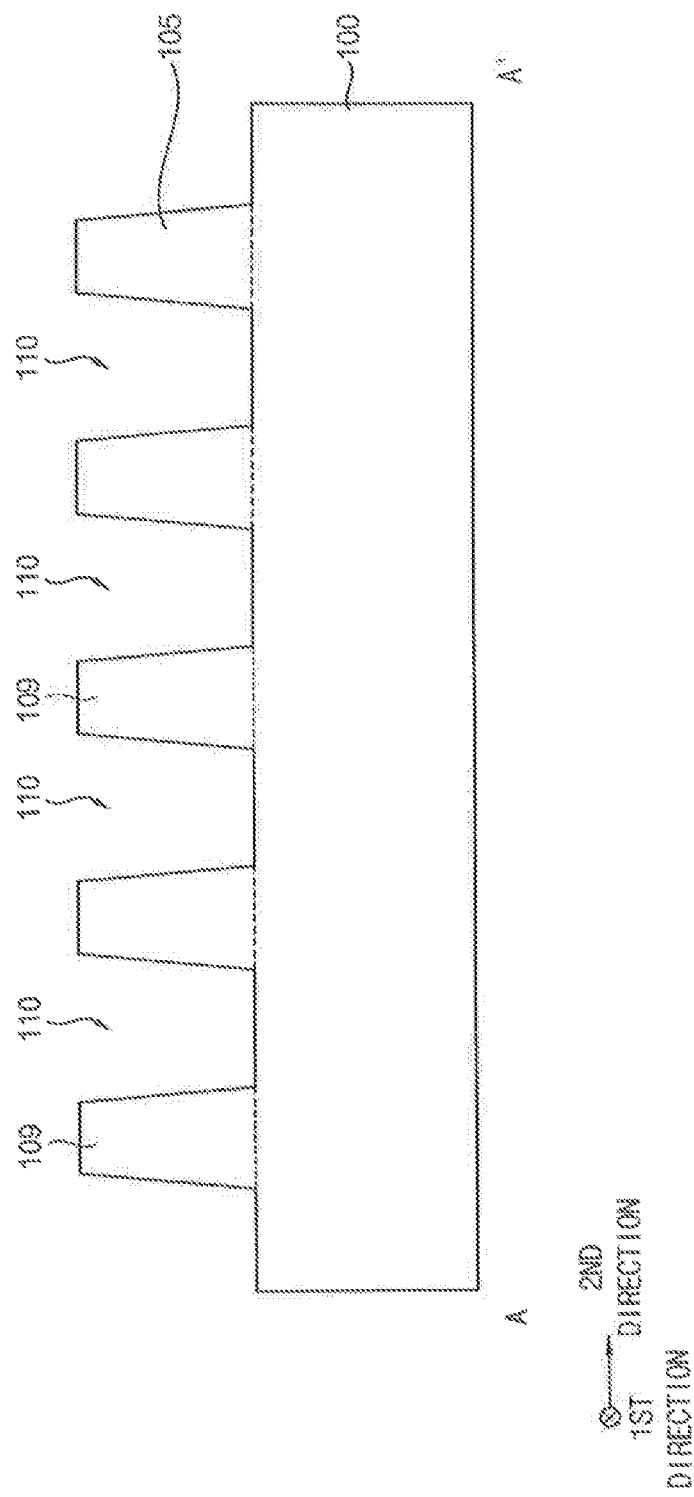

Referring to FIGS. 7 and 8, an upper portion of a substrate 100 may be partially etched to form a first recess 110.

The substrate 100 may include a semiconductor material, e.g., silicon, germanium, or silicon-germanium, or group III-V semiconductor compounds, e.g., GaP, GaAs, or GaSb. In an exemplary embodiment of the present inventive concept, the substrate 100 may be a silicon-on-insulator (SOI) substrate, or a germanium-on-insulator (GOI) substrate.

As the first recess 110 is formed on the substrate 100, an active region 105 and a field region may be defined in the substrate 100. The active region 105 may protrude from an upper surface of the substrate 100, and thus may be also referred to as an active fin.

In an exemplary embodiment of the present inventive concept, the active fin 105 may extend in a first direction substantially parallel to the upper surface of the substrate 100. A plurality of active fins 105 may be arranged along a second direction crossing the first direction, which may also be substantially parallel to the upper surface of the substrate 100. In an exemplary embodiment of the present inventive concept, the first and second directions may cross each other at a right angle, and thus may be substantially perpendicular to each other.

In an exemplary embodiment of the present inventive concept, at least one of the active fins 105 may be a dummy active fin 109. Unlike other active fins 105, a contact plug might not be formed in the dummy active fin 109, and thus an electrical signal might not be applied thereto. FIGS. 7 and 8 show two dummy active fins 109; however, exemplary embodiments of the present inventive concept are not limited thereto.

Figure 9:
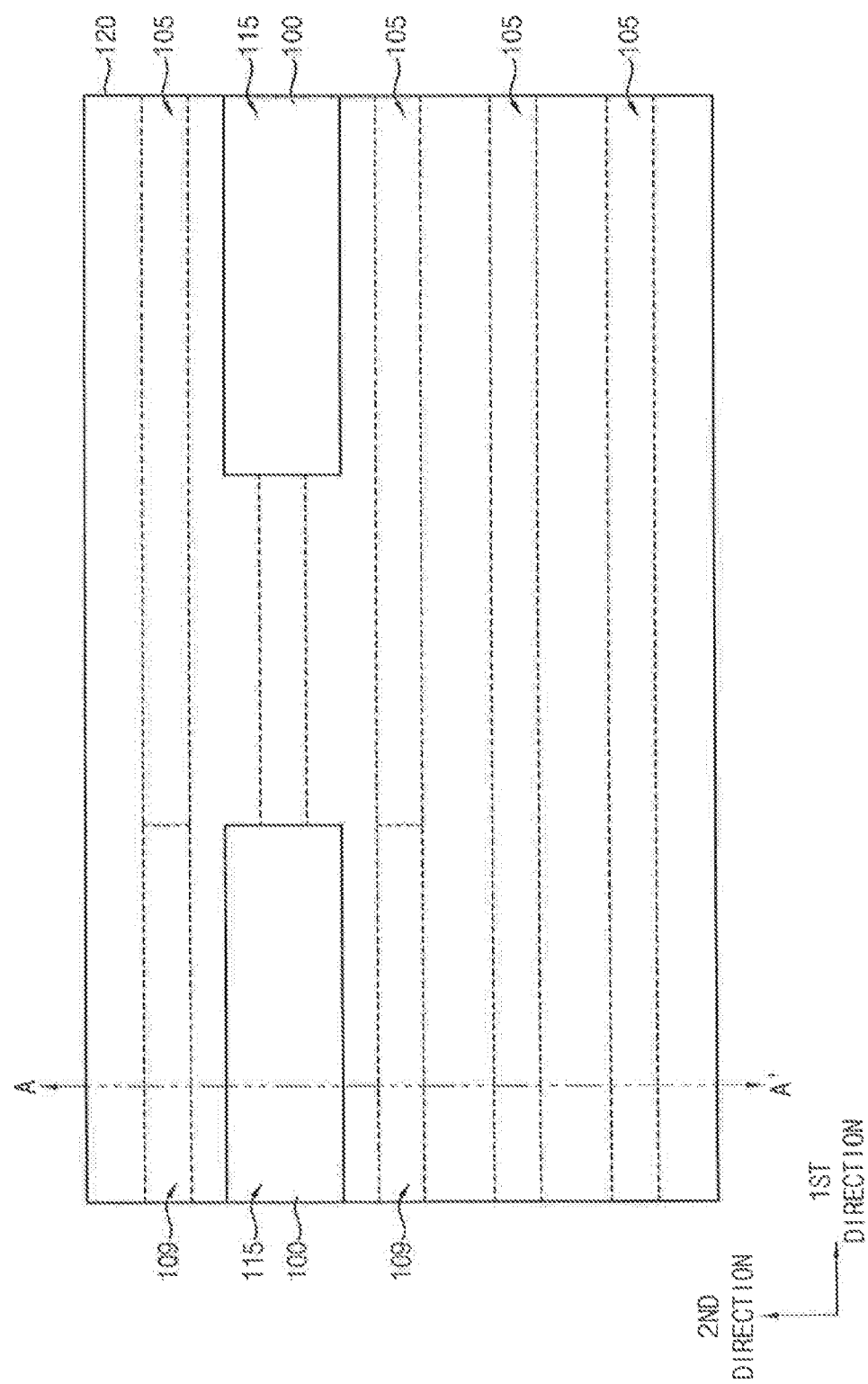
Figure 10:
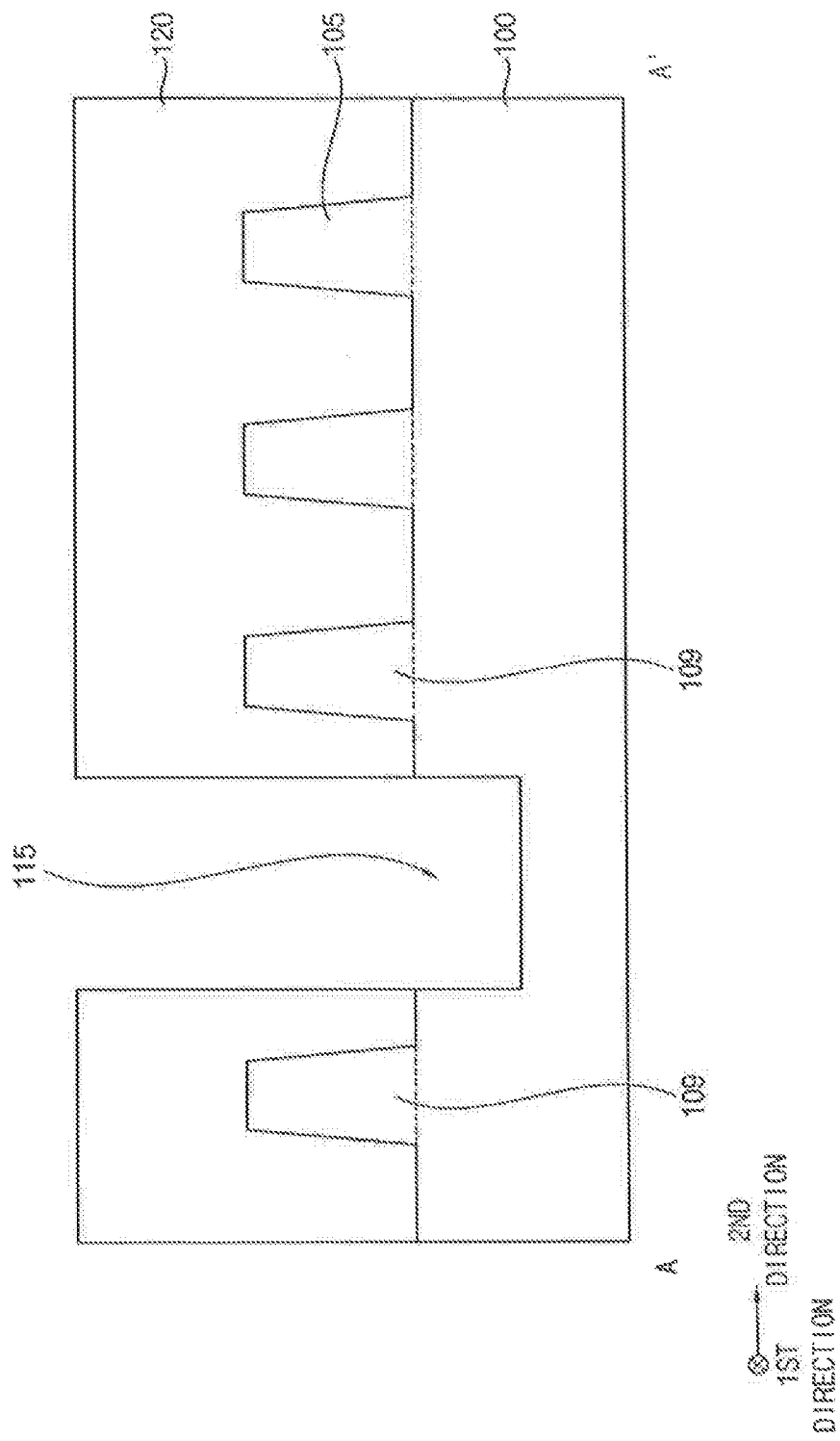

Referring to FIGS. 9 and 10, an etching mask 120 may be formed on the substrate 100, and a portion of the substrate 100 may be removed using the etching mask 120.

In an exemplary embodiment of the present inventive concept, a portion of the active fin 105 and a portion of the substrate 100 thereunder may be removed, and thus a second recess 115 may be formed on the substrate 100.

In an exemplary embodiment of the present inventive concept, an active fin 105 of the active fins 105 adjacent dummy active fins 109 arranged along the second direction may be removed. FIGS. 9 and 10 show an active fin 105 between two adjacent dummy active fins 109; however, exemplary embodiments of the present inventive concept are not limited thereto.

Figure 11:
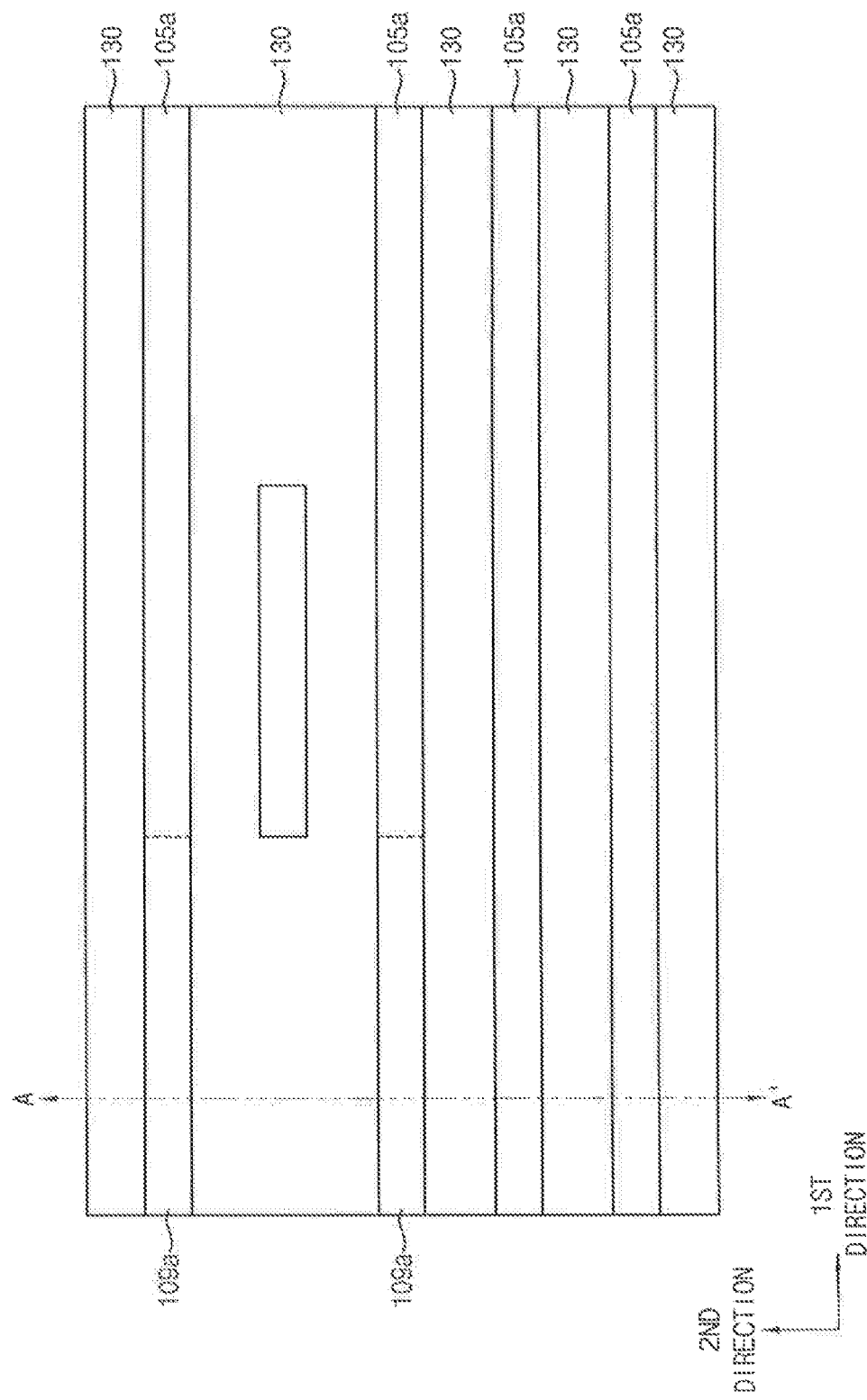
Figure 12:
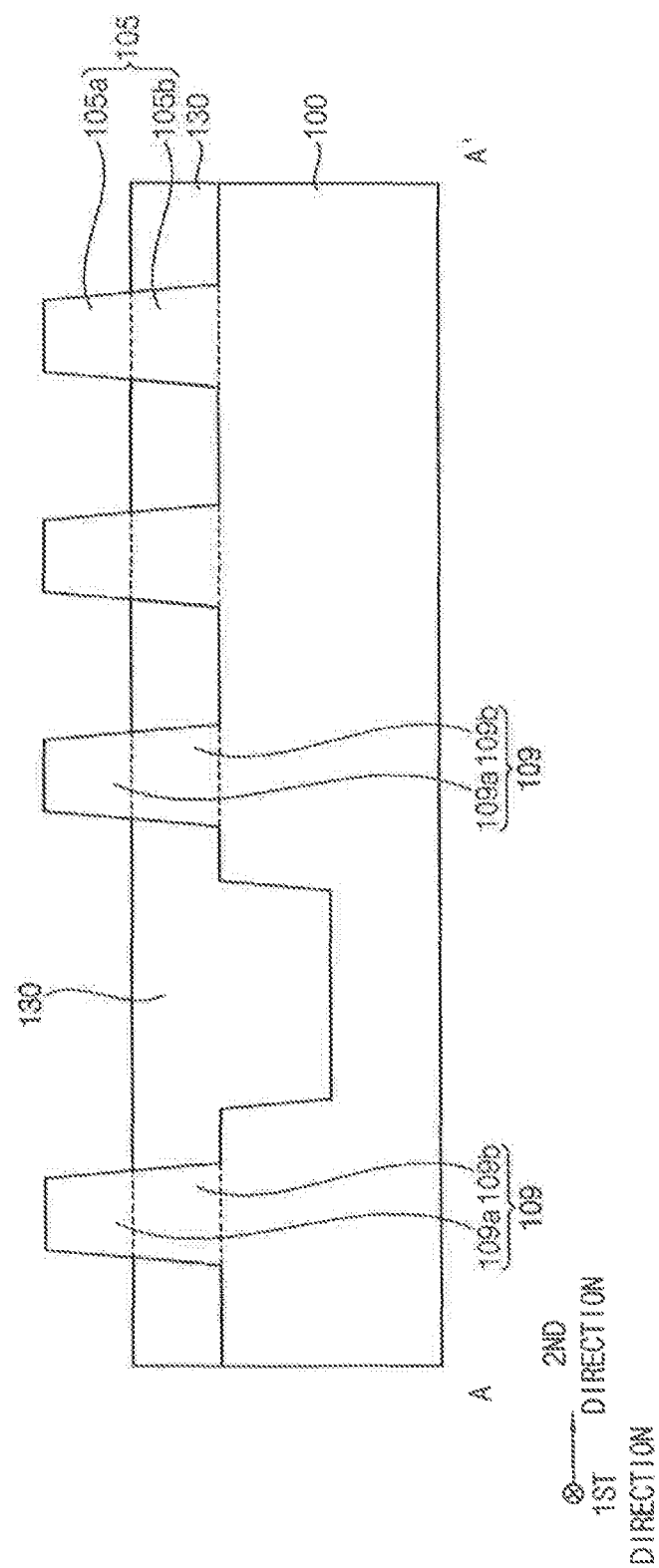

Referring to FIGS. 11 and 12, after removing the etching mask 120, an isolation pattern 130 may be formed substantially filling a portion of the first recess 110 and the second recess 115.

The isolation pattern 130 may be formed by forming an isolation layer on the substrate 100 to substantially fill the first and second recesses 110 and 115, planarizing the isolation layer until an upper surface of the active fin 105 is exposed, and removing an upper portion of the isolation layer to expose an upper portion of the first recess 110.

As the isolation pattern 130 is formed on the substrate 100, the active fin 105 may be divided into a lower active pattern 105*b* having a sidewall which may be substantially covered by the isolation pattern 130, and an upper active pattern 105*a* not covered by the isolation pattern 130 but protruding therefrom. Additionally, the dummy active fin 109 may be divided into a lower dummy active pattern 109*b* having a sidewall which may be substantially covered by the isolation pattern 130, and an upper dummy active pattern 109*a* not covered by the isolation pattern 130 but protruding therefrom.

Figure 13:
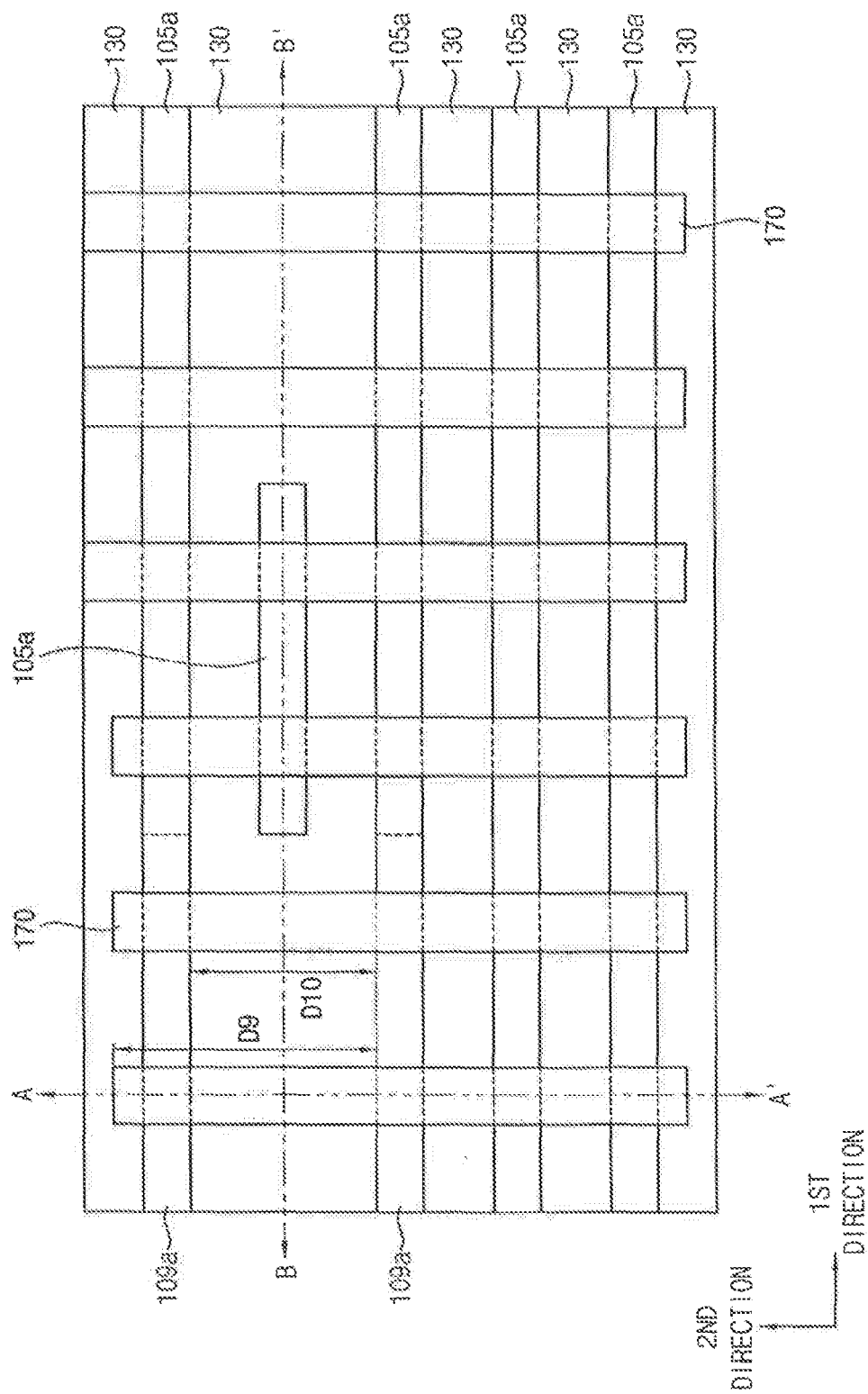
Figure 14:
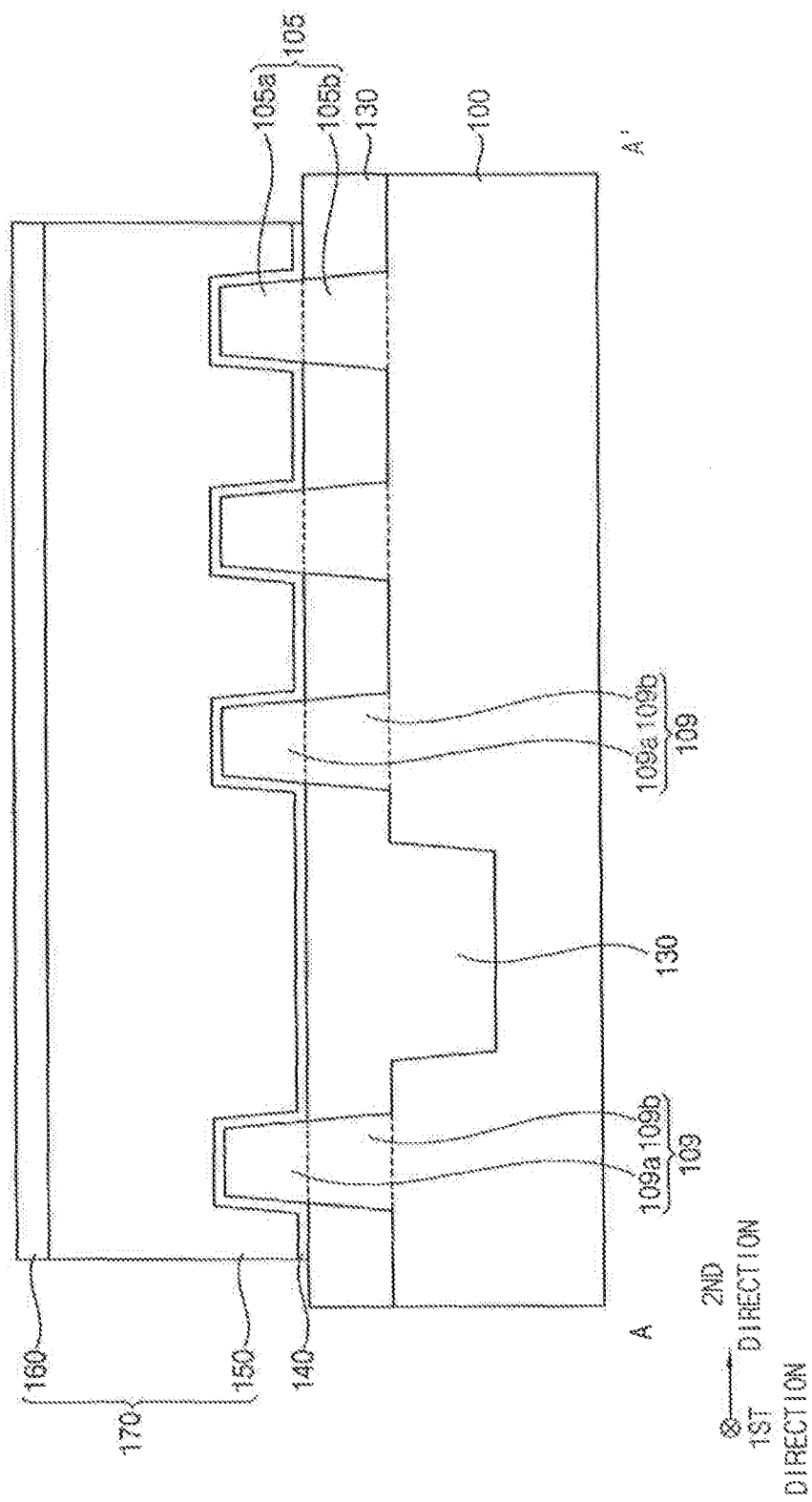
Figure 15:
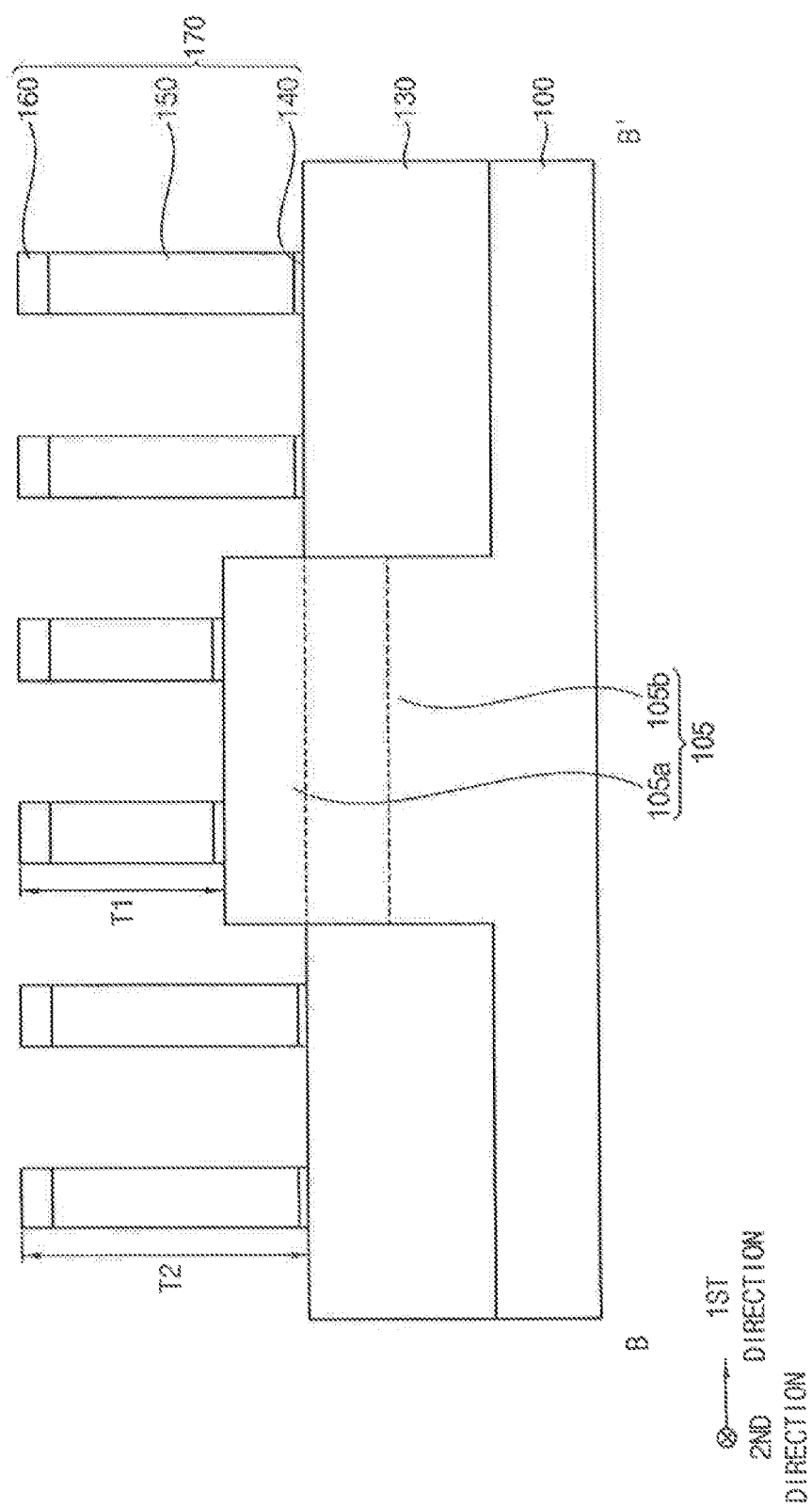

Referring to FIGS. 13 to 15, a dummy gate structure 170 may be formed on the substrate 100.

As an example, the dummy gate structure 170 may be formed by sequentially forming a dummy gate insulation layer, a dummy gate electrode layer and a dummy gate mask layer on the active fin 105 of the substrate 100 and the isolation pattern 130, patterning the dummy gate mask layer to form a dummy gate mask 160, and sequentially etching the dummy gate electrode layer and the dummy gate insulation layer using the dummy gate mask 160 as an etching mask.

Thus, the dummy gate structure 170 may include a dummy gate insulation pattern 140, a dummy gate electrode 150 and the dummy gate mask 160 sequentially stacked on the substrate 100.

The dummy gate insulation layer, the dummy electrode layer, and the dummy gate mask layer may be formed by a chemical vapor deposition (CVD) process, or an atomic layer deposition (ALD) process. Alternatively, the dummy gate insulation layer may be formed by a thermal oxidation process on an upper portion of the substrate 100, and in this case, the dummy gate insulation layer may be formed only on the active fin 105 and the dummy active fin 109.

In an exemplary embodiment of the present inventive concept, the dummy gate structure 170 may be formed to extend in the second direction. A plurality of dummy gate structures 170 may be arranged along the first direction. Lengths of the dummy gate structures 170 in the second direction may be equal to or different from each other.

A second portion of the dummy gate structure 170 on the isolation pattern 130 may have a second thickness T2 greater than a first thickness T1 of a first portion of the dummy gate structure 170 on the active fin 105 or the dummy active fin 109. If a length of the second portion of the dummy gate structure 170 is more than a predetermined length, the dummy gate structure 170 may fall down. If a length of the dummy gate structure 170 not on the active fin 105 (e.g., a ninth distance D9) from an end of the dummy gate structure 170 to a portion of the active fin 105 under the dummy gate structure 170 is more than the predetermined distance, the dummy gate structure 170 may fall down.

However, in an exemplary embodiment of the present inventive concept, the dummy active fin 109 may be formed to extend from the active fin 105, and thus a tenth distance D10 between the dummy active fins 109 (e.g., an extension length of the dummy gate structure 170 between the dummy active fins 109) may be reduced to be equal to or less than the predetermined length. Thus, the dummy gate structure 170 need not fall down due to the dummy active fins 109.

Figure 16:
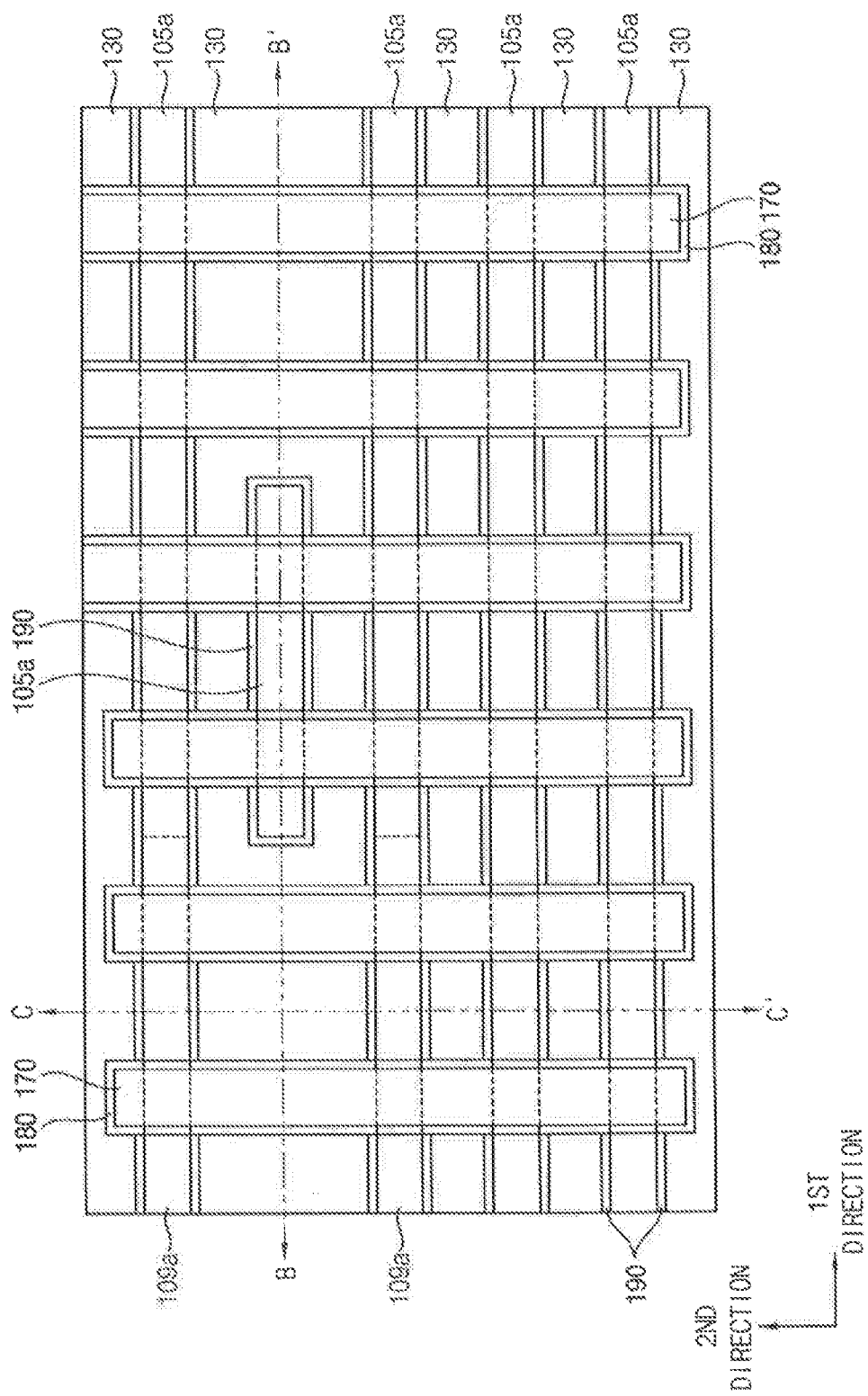
Figure 17:
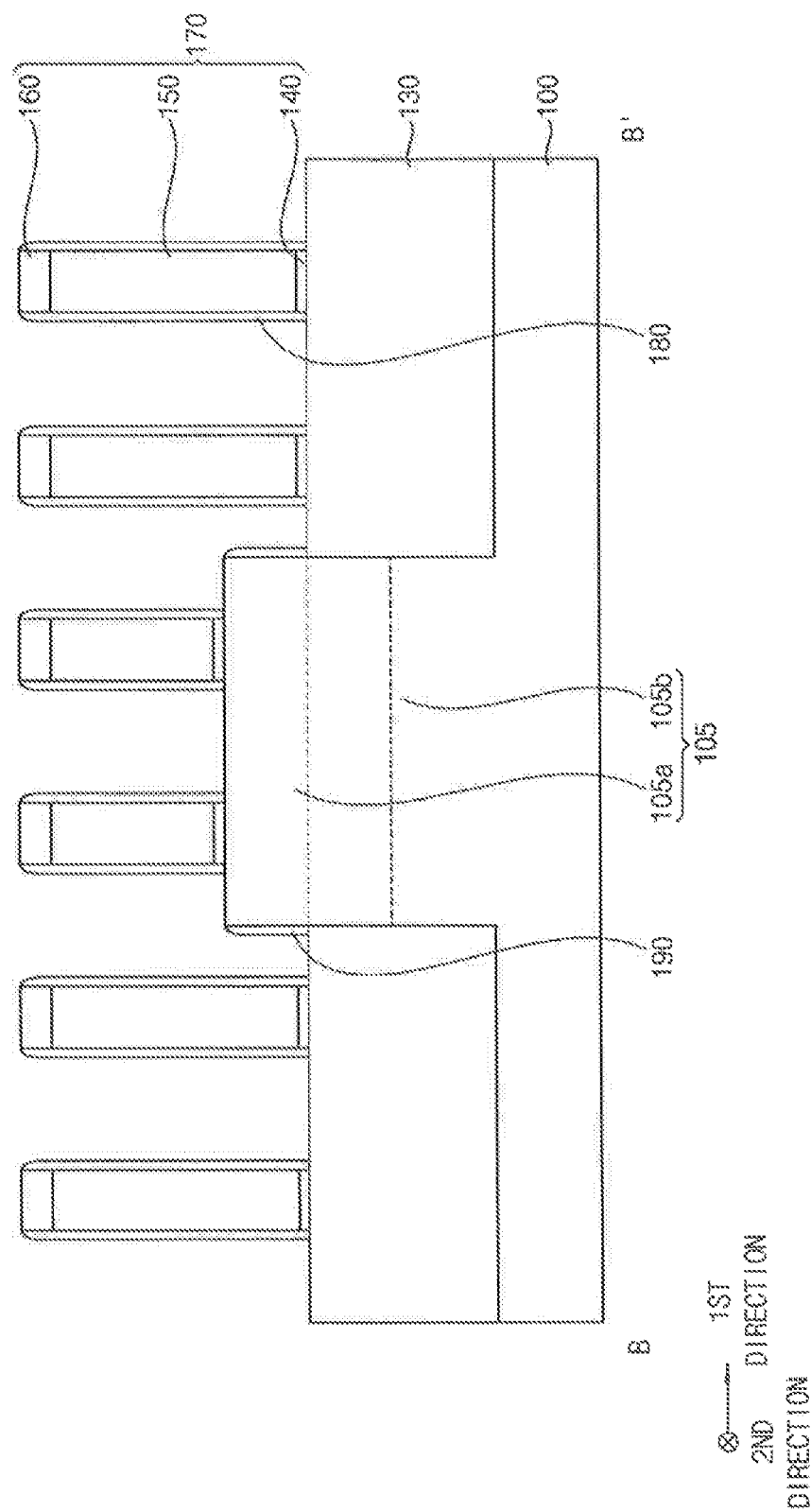
Figure 18:
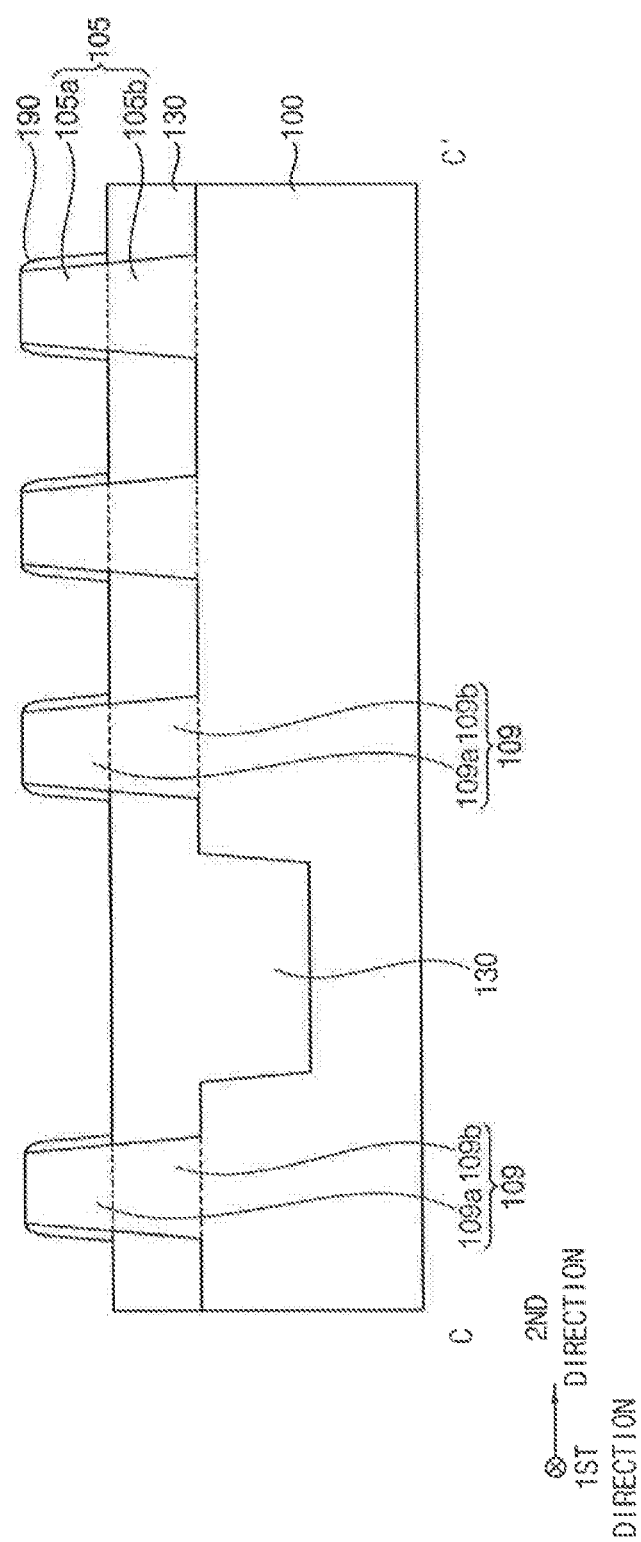

Referring to FIGS. 16 to 18, a gate spacer 180 may be formed on a sidewall of the dummy gate structure 170.

The gate spacer 180 may be formed by forming a spacer layer on the active fin 105, the dummy active fin 109, and the isolation pattern 130 to substantially cover the dummy gate structure 170, and anisotropically etching the spacer layer. The gate spacer 180 may be formed on each of opposite sidewalls of the dummy gate structure 170 in the first direction. A fin spacer 190 may be also formed on each of opposite sidewalls of the upper active pattern 105*a* and the upper dummy active fin 109*a* in the second direction.

Figure 19:
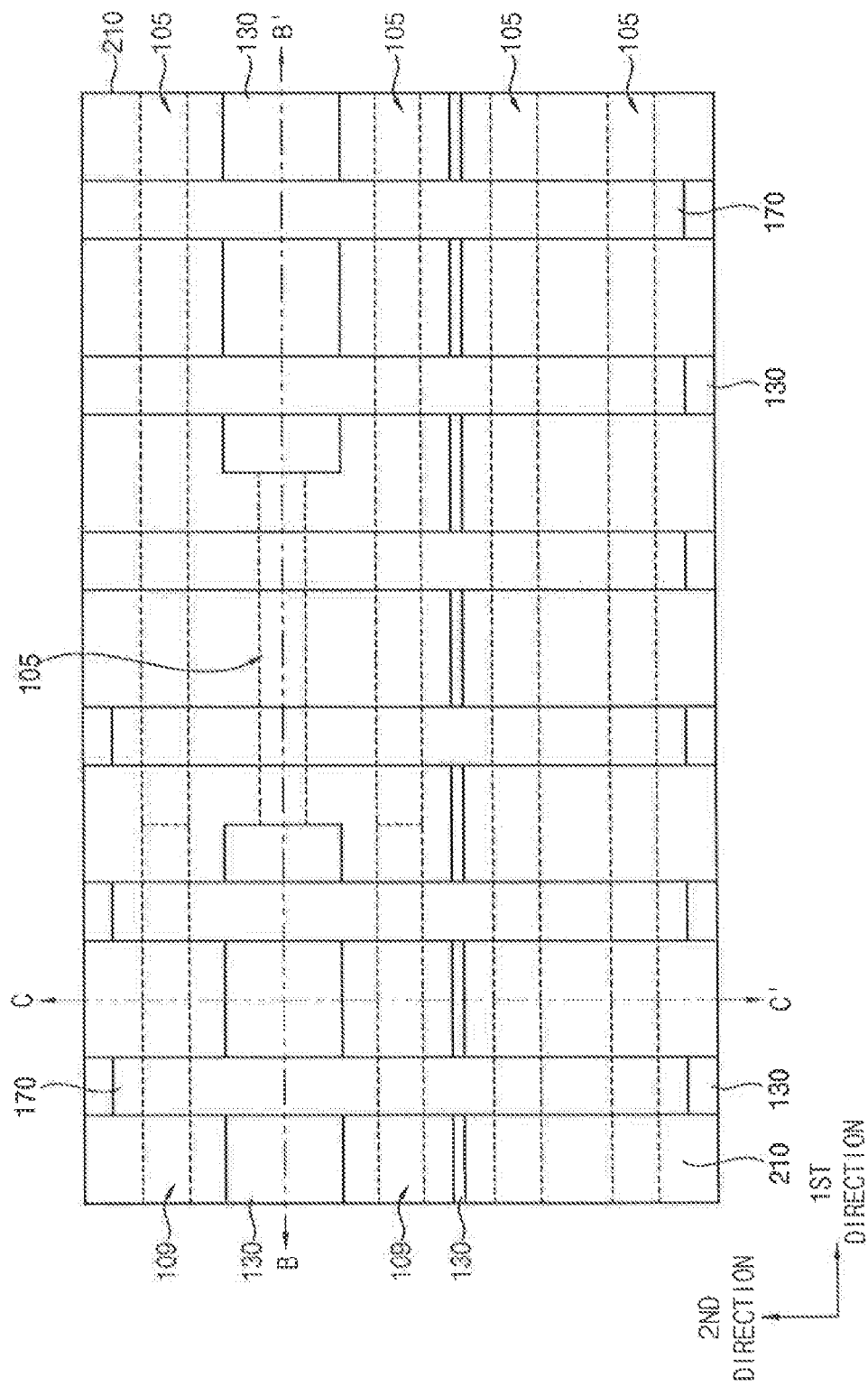
Figure 20:
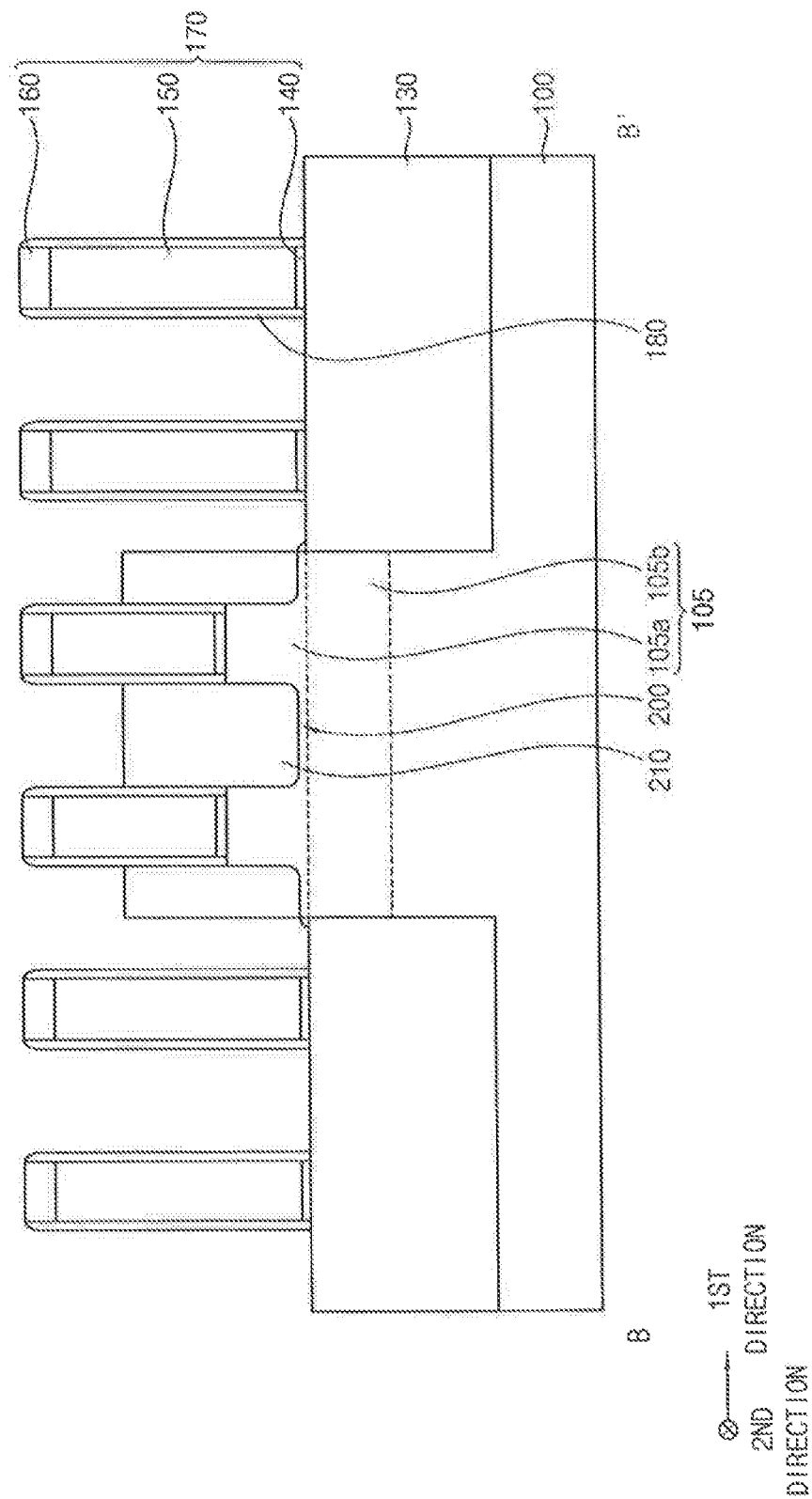
Figure 21:
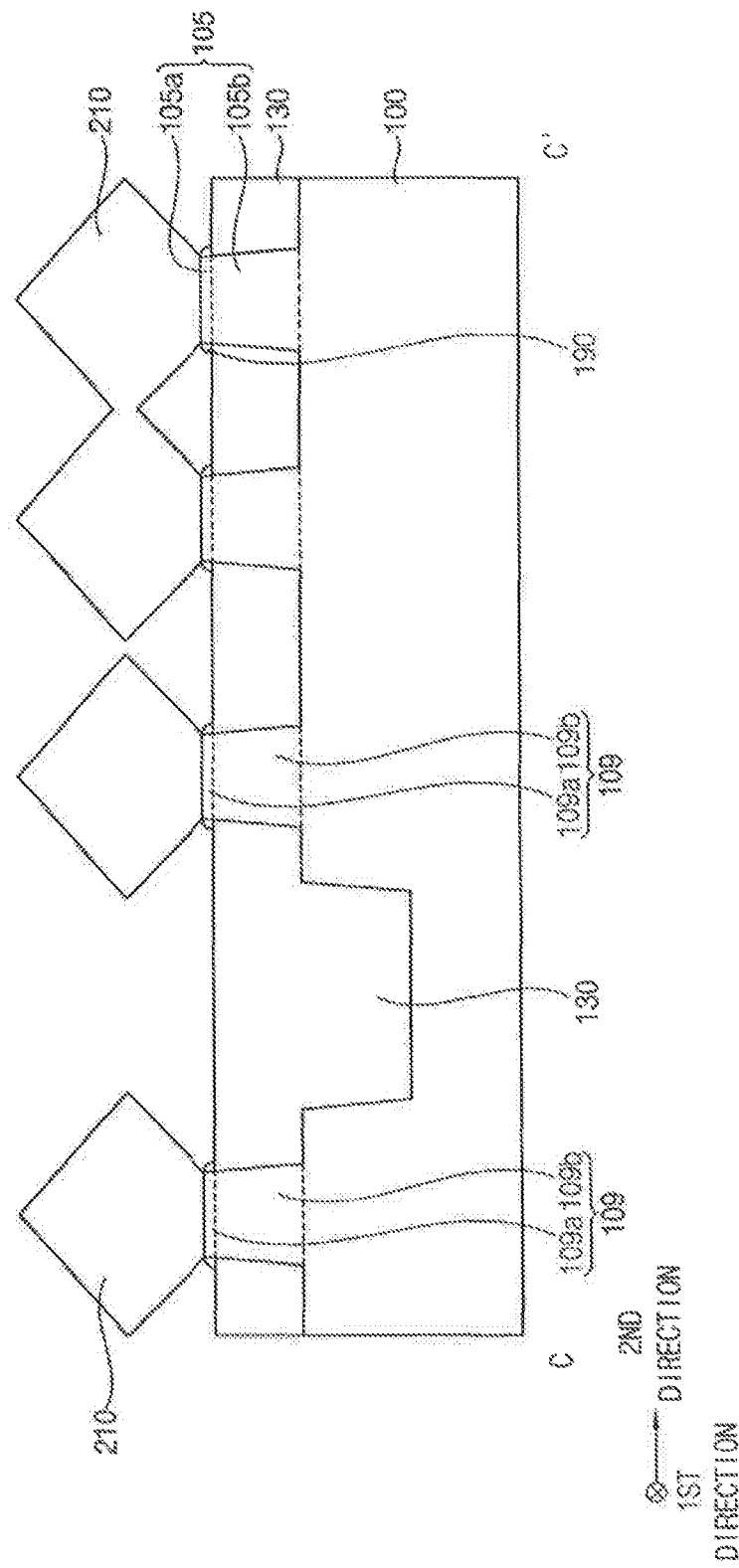
Figure 22:
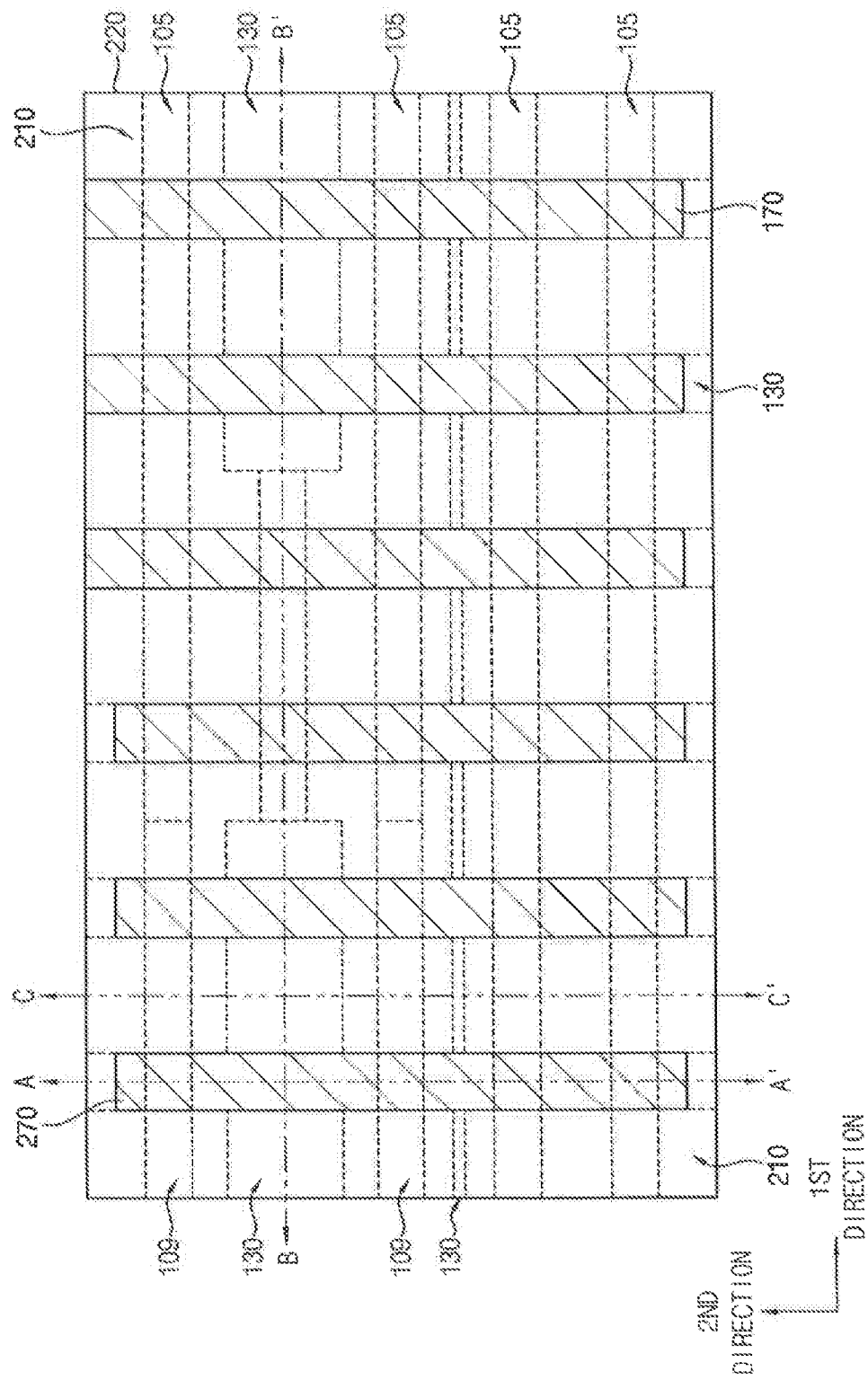
Figure 23:
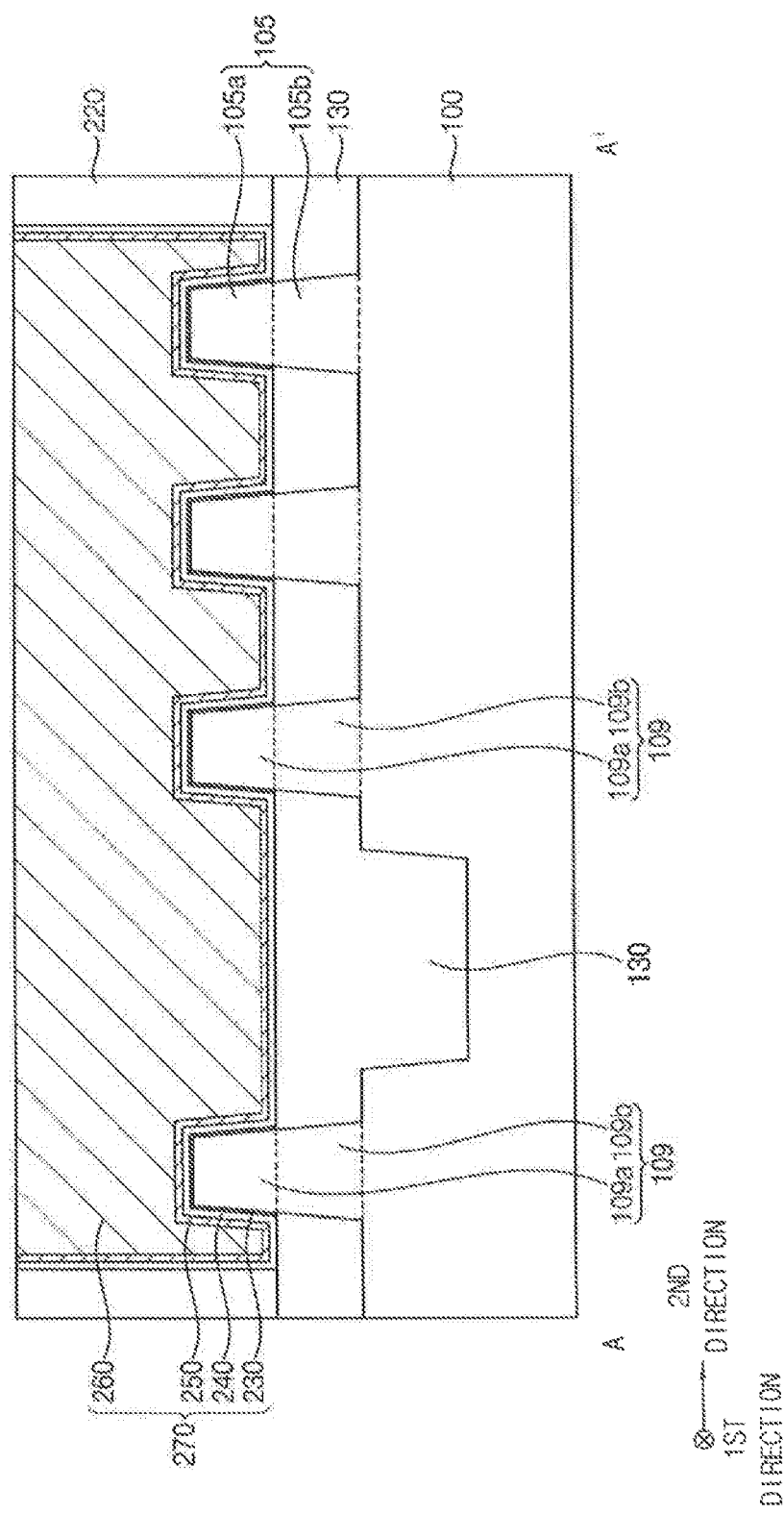
Figure 24:
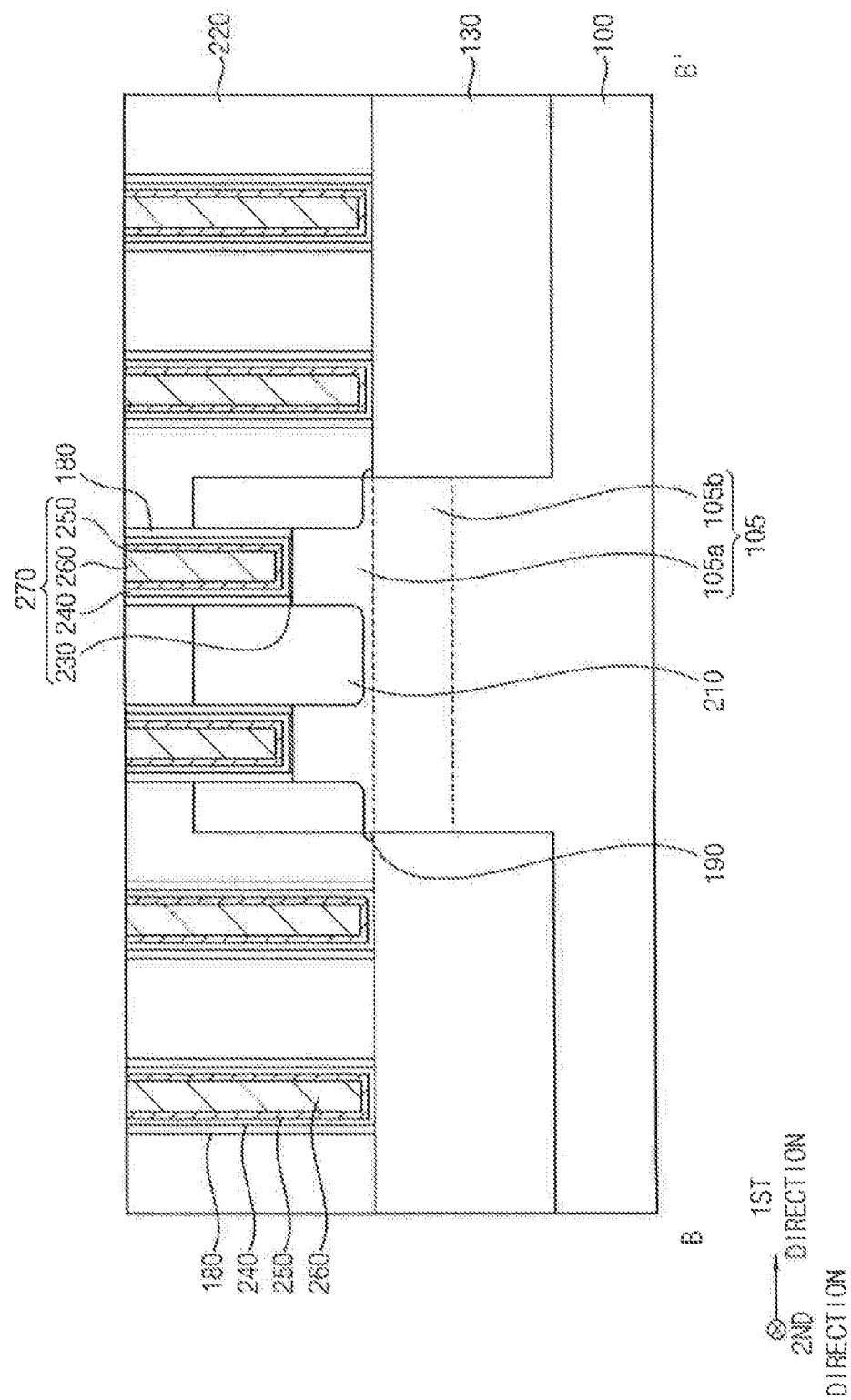
Figure 25:
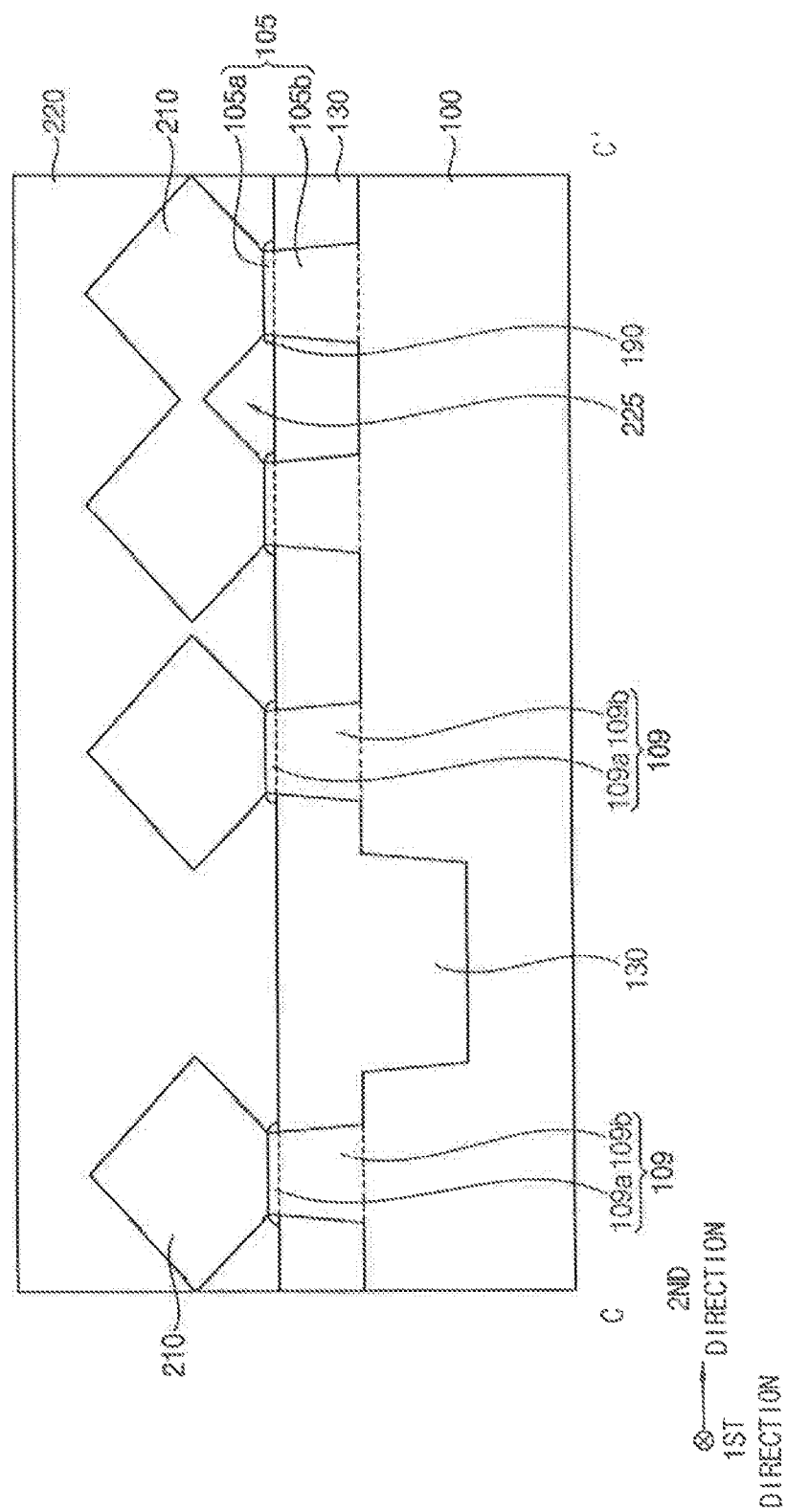
Figure 26:
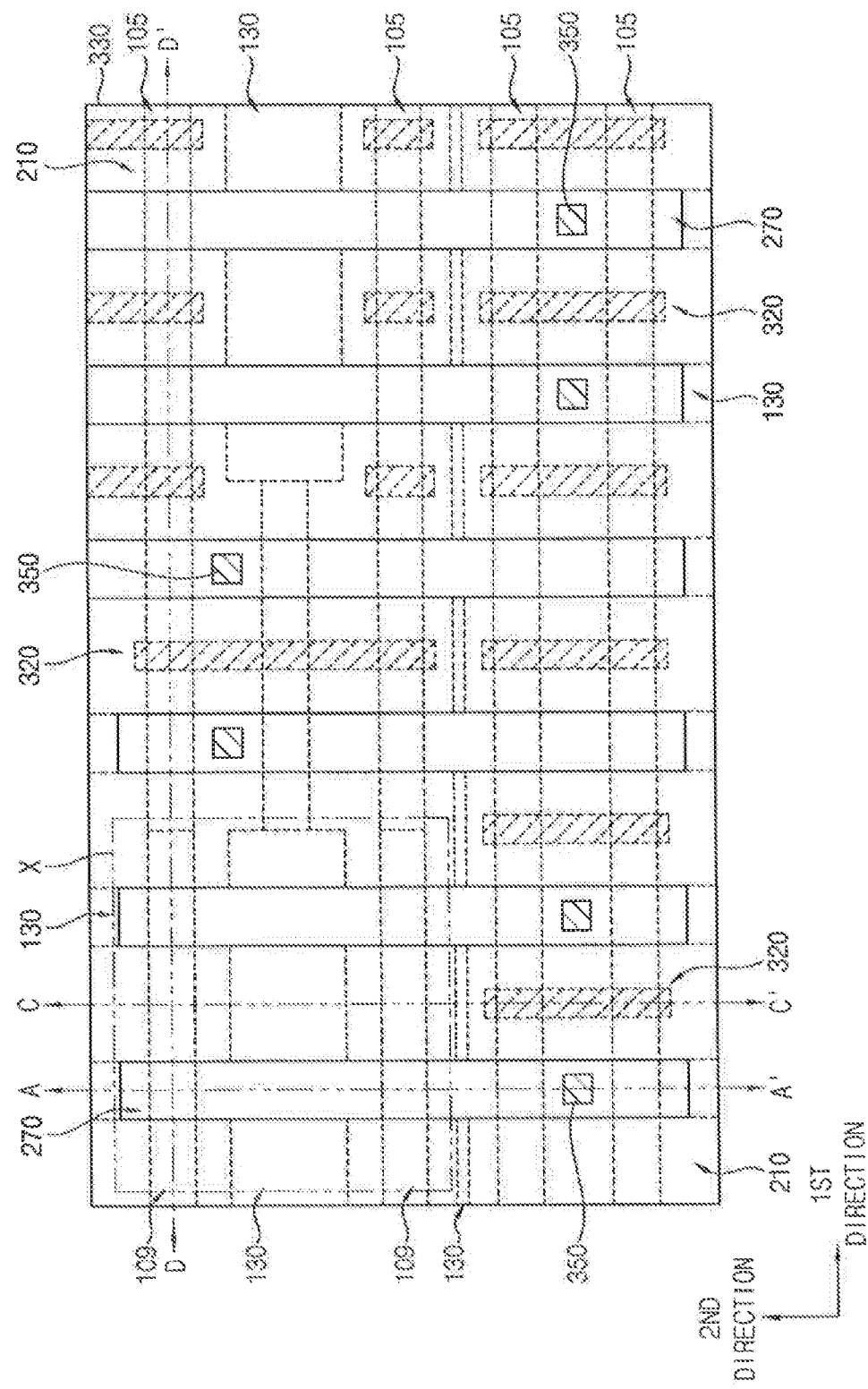
Figure 27:
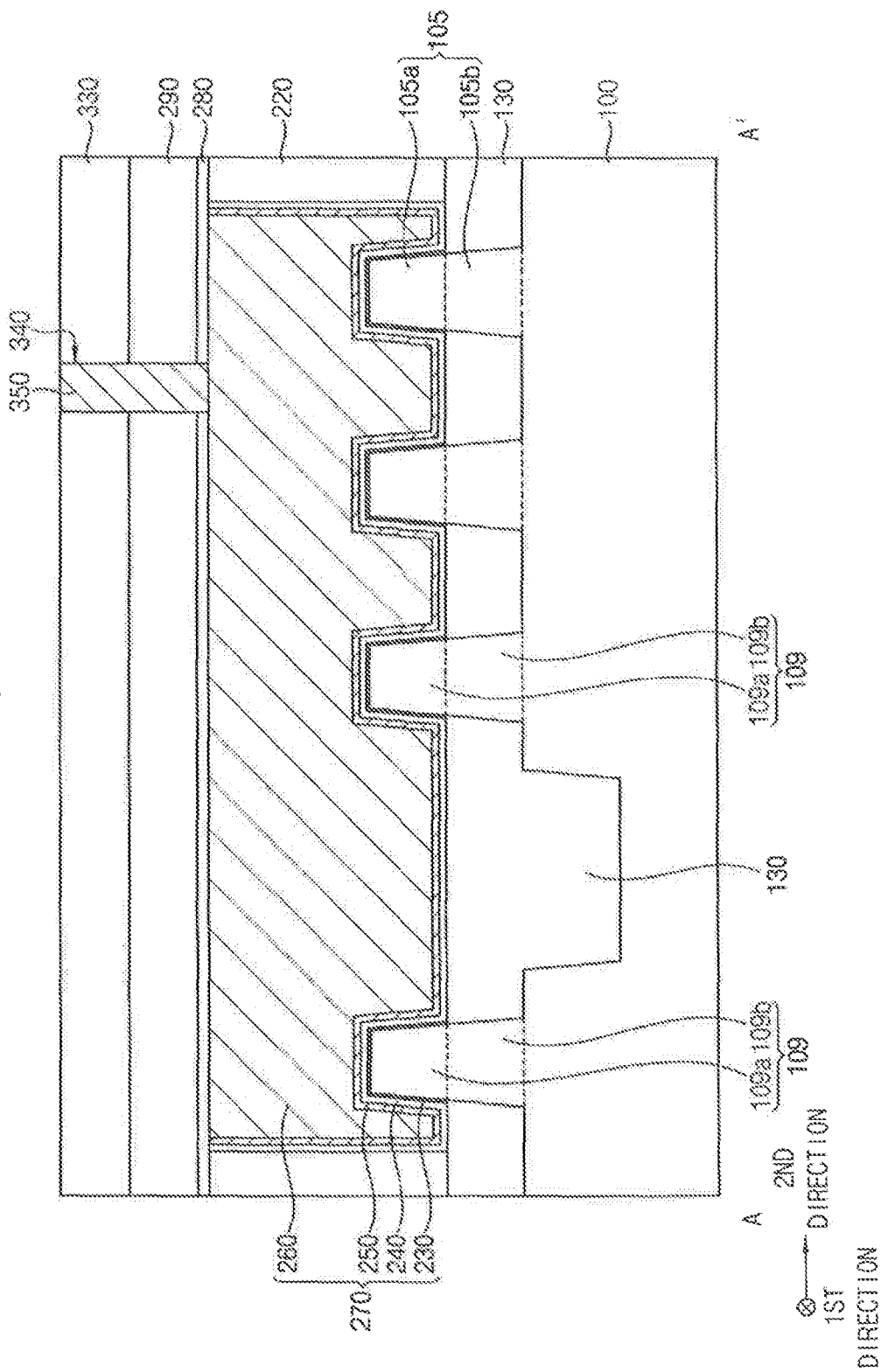
Figure 28:
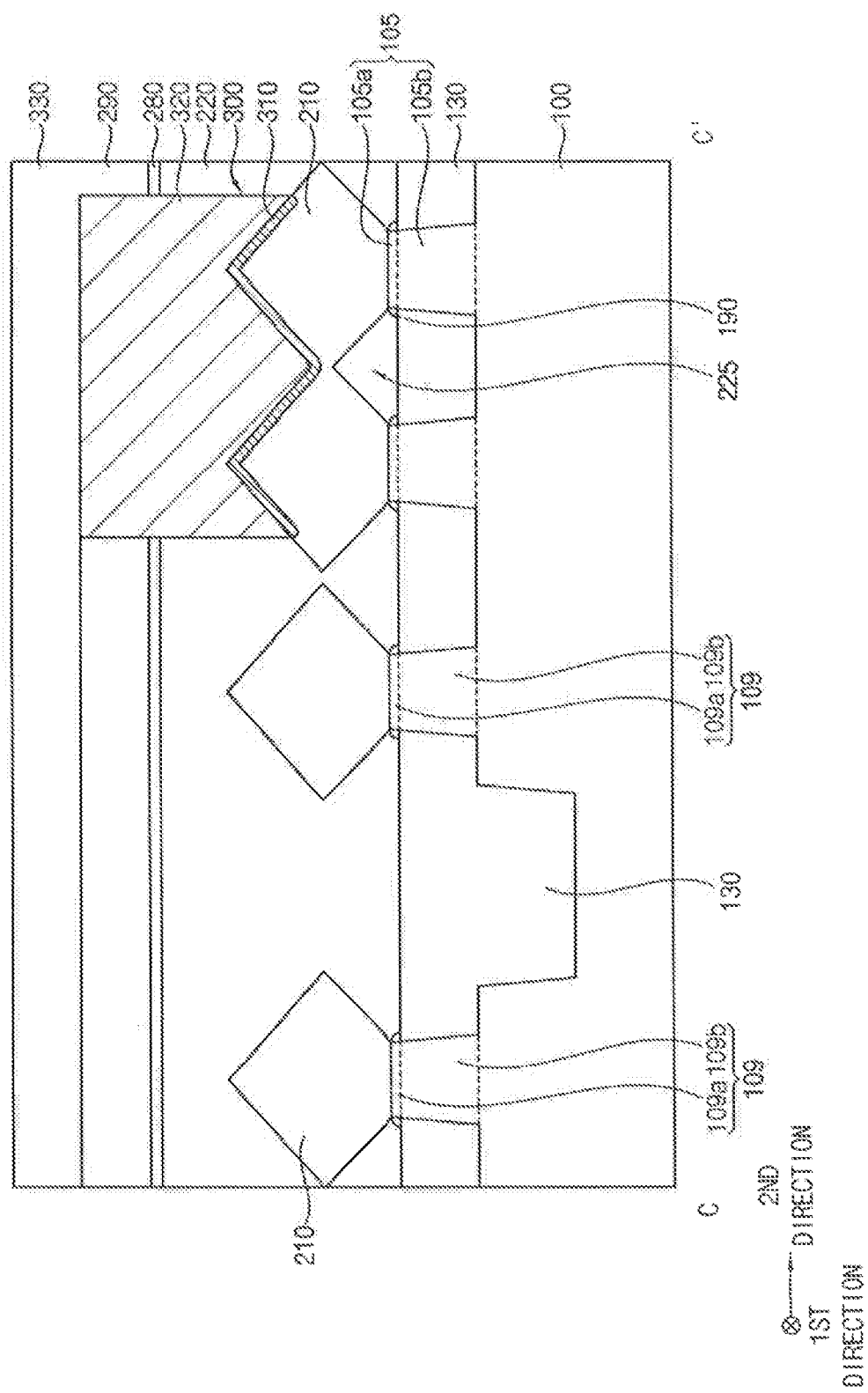

Referring to FIGS. 19 to 21, upper portions of the active fin 105 and the dummy active fin 109 adjacent the gate spacer 180 may be etched to form a third recess 200. In simplified drawings below, the gate spacer 180 and the fin spacer 190 will not be shown in plan views.

As an example, the upper portions of the active fin 105 and the dummy active fin 109 may be removed by a dry etching process using the dummy gate structure 170 and the gate spacer 180 on a sidewall thereof as an etching mask to form the third recess 200. When the third recess 200 is formed, the fin spacer 190 adjacent the active fin 105 and the dummy active fin 109 may be mostly removed, and only a lower portion of the fin spacer 190 may remain.

As a portion of the upper active pattern 105*a* is etched to form the third recess 200, a bottom of the third recess 200 may be higher than a top surface of the lower active pattern 105*b*; however, exemplary embodiments of the present inventive concept are not limited thereto.

A source/drain layer 210 may be formed to substantially fill the third recess 190.

In an exemplary embodiment of the present inventive concept, the source/drain layer 210 may be formed by a selective epitaxial growth (SEG) process using upper surfaces of the active fin 105 and the dummy active fin 109 exposed by the third recess 200 as a seed.

In an exemplary embodiment of the present inventive concept, as the SEG process is performed, a single crystalline silicon-germanium layer may be formed to serve as the source/drain layer 210. Additionally, a p-type impurity source gas may be also used to form a single crystalline silicon-germanium layer doped with p-type impurities serving as the source/drain layer 210. Thus, the source/drain layer 210 may serve as a source/drain region of a PMOS transistor.

The source/drain layer 210 may grow not only in a vertical direction but also in a horizontal direction to substantially fill the third recess 200, and may be in direct contact with a sidewall of the gate spacer 180.

In an exemplary embodiment of the present inventive concept, when the active fins 105 and/or the dummy active fins 109 disposed in the second direction are relatively close to each other, the source/drain layers 210 growing on the respective active fins 105 and/or the dummy active fins 109 may be merged with each other. FIG. 21 shows that two source/drain layers 210 grown on neighboring two active fins 105 are merged with each other; however, exemplary embodiments of the present inventive concept are not limited thereto. Thus, more than two source/drain layers 210 may be merged with each other.

The source/drain layer 210 serving as the source/drain region of the PMOS transistor are illustrated as examples; however, exemplary embodiments of the present inventive concept are not limited thereto, and the source/drain layer 210 may also serve as a source/drain region of an NMOS transistor.

Thus, a single crystalline silicon carbide layer or a single crystalline silicon layer may be formed as the source/drain layer 210. In the SEG process, an n-type impurity source gas may be also used to form a single crystalline silicon carbide layer doped with n-type impurities or a single crystalline silicon layer doped with n-type impurities.

Referring to FIGS. 22 to 25, an insulation layer 220 may be formed on the substrate 100 to substantially cover the dummy gate structure 170, the gate spacer 180, the fin spacer 190, and the source/drain layer 210, and may be planarized until the dummy gate electrode 150 of the dummy gate structure 170 are exposed.

In the planarization process, the dummy gate mask 160 may be removed, and an upper surface of the gate spacer 180 may be removed. A space between the merged source/drain layers 210 and the isolation pattern 130 need not be filled with the insulation layer 220, and thus an air gap 225 may be formed.

The planarization process may be performed by a chemical mechanical polishing (CMP) process and/or an etch back process.

The exposed dummy gate electrode 150 and the dummy gate insulation pattern 140 thereunder may be removed to form a first opening exposing an inner sidewall of the gate spacer 180 and an upper surface of the active fin 105 or the dummy active fin 109, and a gate structure 270 may be formed to substantially fill the first opening.

The gate structure 270 may be formed, for example, by following processes.

After performing a thermal oxidation process on the exposed upper surface of the active fin 105 or the dummy active fin 109 exposed by the first opening to form an interface pattern 230, a gate insulation layer and a workfunction control layer may be sequentially formed on the interface pattern 230, the isolation pattern 130, the gate spacer 180, and the insulation layer 220, and a gate electrode layer may be formed on the workfunction control layer to substantially fill a remaining portion of the first opening.

The interface pattern 230 may be formed instead of the thermal oxidation process, by a CVD process, or an ALD process. In this case, the interface pattern 230 may be formed not only on the upper surface of the active fin 105 or the dummy active fin 109 but also on the upper surface of the isolation pattern 130 and the inner sidewall of the gate spacer 180.

The gate electrode layer, the workfunction control layer, and the gate insulation layer may be planarized until an upper surface of the insulation layer 220 is exposed to form a gate insulation pattern 240 and a workfunction control pattern 250 sequentially stacked on the interface pattern 230, the isolation pattern 130, and the inner sidewall of the gate spacer 180, and a gate electrode 260 filling the remaining portion of the first opening on the workfunction control pattern 250.

The interface pattern 230, the gate insulation pattern 240, the workfunction control pattern 250 and the gate electrode 260 sequentially stacked may form the gate structure 270, and the gate structure 270 together with the source/drain layer 210 may form a PMOS transistor or an NMOS transistor according to the conductivity type of the source/drain layer 210.

In simplified drawings below, the gate insulation pattern 240 and the workfunction control pattern 250 of the gate structure will not be shown in plan views.

Referring to FIGS. 26 to 29, a capping layer 280 and a first insulating interlayer 290 may be sequentially formed on the insulation layer 220, the gate structure 270, and the gate spacer 180, and a first contact plug 320 may be formed through the insulation layer 220, the capping layer 280, and the first insulating interlayer 290 to contact an upper surface of the source/drain layer 210.

The first contact plug 320 may be formed, for example, by following processes.

A second opening 300 may be formed through the insulation layer 220, the capping layer 280 and the first insulating interlayer 290 to expose the upper surface of the source/drain layer 210. A first metal layer may be formed on the exposed upper surface of the source/drain layer 210, a sidewall of the second opening 300, and the upper surface of the first insulating interlayer 290, and a heat treatment process may be performed thereon to form a first metal silicide pattern 310 on the source/drain layer 210.

A first barrier layer may be formed on the first metal silicide pattern 310, the sidewall of the second opening 300, and the upper surface of the first insulating interlayer 290. A second metal layer may be formed on the first barrier layer to substantially fill the second opening 300. The second metal layer and the first barrier layer may be planarized until the upper surface of the first insulating interlayer 290 is exposed.

Thus, the first contact plug 320 may be formed on the first metal silicide pattern 310 to substantially fill the second opening 300.

The first contact plug 320 may include a second metal pattern and a first barrier pattern substantially covering a lower surface and a sidewall of the second metal pattern.

The first contact plug 320 may extend in the second direction to a predetermined length. A plurality of first contact plugs 320 may be arranged along the first direction.

In an exemplary embodiment of the present inventive concept, the first contact plug 320 need not be formed on a portion of the source/drain 210 on the dummy active fin 109. The dummy active fin 109 may be formed to reduce the thickness of the dummy gate structure 170 or the gate structure 270, which may prevent the dummy gate structure 170 or the gate structure 270 from falling down, and thus an electrical signal might not be applied thereto. Thus, the first contact plug 320 need not be formed on the portion of the source/drain 210 on the dummy active fin 109 so as not to be electrically connected to a conductive line 380 (see, e.g., FIGS. 30 to 35) subsequently formed.

After a second insulating interlayer 330 is formed on the first insulating interlayer 290 and the first contact plug 320, a third opening 340 exposing an upper surface of one of the gate structures 270 and extending through the second insulating interlayer 330, the first insulating interlayer 290 and the capping layer 280 may be formed. A second contact plug 350 may be formed to substantially fill the third opening 340.

In an exemplary embodiment of the present inventive concept, the second contact plug 350 may be formed by forming a second barrier layer on a bottom and a sidewall of the third opening 340, and an upper surface of the second insulating interlayer 330, forming a third metal layer on the second barrier layer to substantially fill the third opening 340, and planarizing the third metal layer and the second barrier layer. Thus, the second contact plug 350 may include a third metal pattern and a second barrier pattern substantially covering a bottom and a sidewall of the third metal pattern.

In an exemplary embodiment of the present inventive concept, the second contact plug 350 need not be formed on a portion of the gate structure 270 between the dummy active fins 109.

As an example, the first and second contact plugs 320 and 350 need not be formed in a region X including the dummy active fins 109 and the portion of the gate structure 270 therebetween, and need not be electrically connected to the overlying conductive line 380.

Referring to FIGS. 30 to 35, a third insulating interlayer 360 may be formed on the second insulating interlayer 330 and the second contact plug 350. The conductive line 380 extending through an upper portion of the third insulating interlayer 360, a first via 370 extending through a lower portion of the third insulating interlayer 360 and the second insulating interlayer 330, and a second via 375 extending through a lower portion of the third insulating interlayer 360 may be formed.

In an exemplary embodiment of the present inventive concept, the conductive line 380 and the first and second vias 370 and 375 may be substantially simultaneously formed by a dual damascene process. Thus, each of the conductive line 380 and the first and second vias 370 and 375 may include a fourth metal pattern and a third barrier pattern substantially covering a bottom and a sidewall of the fourth metal pattern.

Alternatively, the conductive line 380 and the first and second vias 370 and 375 may be independently formed by a single damascene process.

In an exemplary embodiment of the present inventive concept, the conductive line 380 may extend in the first direction. A plurality of conductive lines 380 may be arranged along the second direction. In an exemplary embodiment of the present inventive concept, the first via 370 may be formed under the conductive line 380 and may be in direct contact with an upper surface of the first contact plug 320. The second via 375 may be formed under the conductive line 380 and may be in direct contact with an upper surface of the second contact plug 350. The third via 386 may be formed under the first conductive line 392 or the second conductive line 394 and may be in direct contact with an upper surface of the fourth contact plug 354.

In an exemplary embodiment of the present inventive concept, the first and second vias 370 and 375 need not be formed under a portion of the conductive line 380 in the region X.

By the above processes, the semiconductor device may be manufactured.

In the above method of manufacturing the semiconductor device, when the length of the portion of the dummy gate structure 170 not contacting the active fin 105 is more than the predetermined length, the dummy active fin 109 extending from the active fin 105 may be further formed to reduce the length of the portion of the dummy gate structure 170 not contacting the active fin 105 below the predetermined length, and thus the dummy gate structure 170 need not fall down. The dummy active fin 109 may prevent the dummy gate structure 170 from falling down, and thus an electrical signal might not be applied thereto. Thus, contact plugs and vias might not be formed on the dummy active fin 109 or a portion of the dummy gate structure 170 adjacent thereto.

Thus, when the distance from the active fin 105 on which the gate structure 270 is formed to the end of the gate structure 270 is more than the predetermined distance, and when the distance from the dummy active fin 109 on which the gate structure 270 is formed to the end of the gate structure 270 is equal to or less than the predetermined distance, the first contact plug 320 need not be formed on portions of the dummy active fin 109 at opposite sides of the gate structure 270. Additionally, the second contact plug 350 need not be formed on the portion of the gate structure 270 from the active fin 105 to the end of the gate structure 270.

When the distance between the active fins 105 on which the gate structures 270 are formed, respectively, is more than the predetermined distance, and when the distance from the dummy active fin 109 between the active fins 105 on which the gate structure 270 is formed to the active fin 105 is equal to or less than the predetermined distance, the first contact plug 320 need not be formed on portions of the dummy active fin 109 at opposite sides of the gate structure 270. Additionally, the second contact plug 350 need not be formed on the portion of the gate structure 270 between the active fins 105.

The above method of designing the layout of the semiconductor device, the method of manufacturing the semiconductor device, and the semiconductor device may be applied to wiring structures of various types of memory devices, for example, logic devices such as central processing units (CPUs), main processing units (MPUs), or application processors (APs), volatile memory devices such as DRAM devices or SRAM devices, or non-volatile memory devices such as flash memory devices, PRAM devices, MRAM devices, or RRAM devices.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A semiconductor device comprising:
   active fins each extending in a first direction, wherein the active fins are arranged along a second direction crossing the first direction on a substrate;

gate lines each extending in the second direction, wherein the gate lines are arranged along the first direction on the active fins;

first contact plugs, wherein at least one of the first contact plugs is positioned on a respective one of the active fins;

first vias, wherein each of the first vias is formed in a respective one of the first contact plugs; and first conductive lines, wherein at least one of the first conductive lines overlaps a respective one of the first vias along a third direction orthogonal to the first and second directions, wherein a first distance from a first active fin of the active fins which a first gate line of the gate lines is formed to an end of the first gate line is equal to or greater than a predetermined distance, wherein a second distance from a second active fin of the active fins on which the first gate line is formed to the first active fin of the active fins is less than the predetermined distance, and wherein the second active fin is spaced apart from the first contact plugs to not overlap the first contact plugs along the third direction orthogonal to the first and second directions.

2. The semiconductor device of claim 1, further comprising second contact plugs, wherein at least one of the second contact plugs is positioned on a respective one of the gate lines, and wherein the second contact plugs are spaced apart from a portion of the first gate line from the first active fin to the end of the first gate line.

3. The semiconductor device of claim 2, further comprising:

second vias, wherein each of the second vias is formed in a respective one of the second contact plugs; and second conductive lines, wherein at least one of the second conductive lines overlaps a respective one of the second vias along the third direction orthogonal to the first and second directions.

4. The semiconductor device of claim 1, wherein the first and second directions are substantially perpendicular to each other, and wherein each of the first conductive lines extends in the first direction.

5. The semiconductor device of claim 1, further comprising a source/drain layer between the active fins and the first contact plugs.

6. The semiconductor device of claim 5, wherein the source/drain layer commonly contacts a plurality of third active fins of the active fins.

7. A semiconductor device comprising:

active fins each extending in a first direction, wherein the active fins are arranged along a second direction crossing the first direction on a substrate;

gate lines each extending in the second direction, wherein the gate lines are arranged along the first direction on the active fins;

first contact plugs, wherein at least one of the first contact plugs is positioned on a respective one of the active fins;

first vias, wherein each of the first vias is formed in a respective one of the first contact plugs; and first conductive lines, wherein at least one of the first conductive lines overlaps a respective one of the first vias along a third direction orthogonal to the first and second directions, wherein a first distance between two first active fins of the active fins on which a first gate line of the gate lines is formed is at least as long as a predetermined distance, and a second distance from a second active fin of the active fins on which the first gate line is formed to each of the first active fins is less than the predetermined distance, wherein the second active fin is positioned between the two first active fins along the second direction, and wherein the second active fin is spaced apart from the first contact plugs to not overlap the first contact plugs along the third direction orthogonal to the first and second directions.

8. The semiconductor device of claim 7, further comprising second contact plugs, wherein at least one of the second contact plugs is positioned on a respective one of the gate lines, and wherein the second contact plugs are not formed on a portion of the first gate line between the two first active fins.

9. The semiconductor device of claim 8, further comprising:

second vias, wherein each of the second vias is formed in a respective one of the second contact plugs; and second conductive lines, wherein at least one of the second conductive lines overlaps a respective one of the second vias along the third direction orthogonal to the first and second directions.

10. The semiconductor device of claim 7, wherein the first and second directions are substantially perpendicular to each other, and wherein each of the first conductive lines extends in the first direction.

11. The semiconductor device of claim 7, further comprising a source/drain layer between the active fins and the first contact plugs.

12. The semiconductor device of claim 11, wherein the source/drain layer commonly contacts a plurality of third active fins of the active fins.

13. A semiconductor device comprising:

a plurality of active fins extending in a first direction, wherein the plurality of active fins includes a first active fin, a second active fin and a third active fin sequentially arranged along a second direction crossing the first direction;

a plurality of conductive lines extending in the first direction;

a plurality of gate lines extending in the second direction, wherein a first gate line of the plurality of gate lines crosses the first, second and third active fins, wherein a first portion of the first gate line extending from the first active fin across the second and third active fins is at least as long as a predetermined distance, and wherein a distance between the second and third active fins is less than the predetermined distance; and a plurality of contact plugs including a via formed in each of the contact plugs, wherein a first contact plug of the plurality of contact plugs is formed on a conductive line of the plurality of conductive lines and a second portion of the first gate line on an opposite side of the first active fin from the first portion of the first gate line.

14. The semiconductor device of claim 13, wherein the first direction is perpendicular to the second direction.

15. The semiconductor device of claim 14, wherein the first active fin is configured to receive an electrical signal at the second portion of the at least one gate line.

16. The semiconductor device of claim 15, wherein a second gate line of the plurality of gate lines extending in the second direction is spaced apart from the second and third active fins along the first direction, and wherein a second contact plug is formed on the second gate line.

17. The semiconductor device of claim 16, wherein the second gate line crosses a fourth active fin extending in the first direction and spaced apart from the first gate line in the first direction.

18. The semiconductor device of claim 17, wherein the fourth active fin is positioned between the second and third active fins along the second direction.

* * * * *